United States Patent
Kosowsky et al.

(10) Patent No.: US 7,793,236 B2
(45) Date of Patent: Sep. 7, 2010

(54) SYSTEM AND METHOD FOR INCLUDING PROTECTIVE VOLTAGE SWITCHABLE DIELECTRIC MATERIAL IN THE DESIGN OR SIMULATION OF SUBSTRATE DEVICES

(75) Inventors: Lex Kosowsky, San Jose, CA (US); Robert Fleming, San Jose, CA (US)

(73) Assignee: Shocking Technologies, Inc., San Jose, CA (US)

( * ) Notice: Subject to any disclaimer, the term of this patent is extended or adjusted under 35 U.S.C. 154(b) by 562 days.

(21) Appl. No.: 11/860,530

(22) Filed: Sep. 24, 2007

(65) Prior Publication Data

US 2008/0313576 A1    Dec. 18, 2008

Related U.S. Application Data

(60) Provisional application No. 60/943,556, filed on Jun. 13, 2007.

(51) Int. Cl.
*G06F 17/50*    (2006.01)
(52) U.S. Cl. .............................. 716/2; 716/18
(58) Field of Classification Search .............. 716/1, 716/2, 18
See application file for complete search history.

(56) References Cited

U.S. PATENT DOCUMENTS

| | | |
|---|---|---|
| 3,347,724 A | 10/1967 | Schneble, Jr. et al. |
| 3,685,026 A | 8/1972 | Wakabayashi et al. |
| 3,685,028 A | 8/1972 | Wakabayashi et al. |
| 3,723,635 A | 3/1973 | Smith |
| 3,808,576 A | 4/1974 | Castonguay et al. |
| 3,926,916 A | 12/1975 | Mastrangelo |
| 3,977,957 A | 8/1976 | Kosowsky et al. |
| 4,113,899 A | 9/1978 | Henry et al. |
| 4,133,735 A | 1/1979 | Afromowitz et al. |
| 4,252,692 A | 2/1981 | Taylor et al. |
| 4,331,948 A | 5/1982 | Malinaric et al. |
| 4,359,414 A | 11/1982 | Mastrangelo |

(Continued)

FOREIGN PATENT DOCUMENTS

CH    663491 A5    12/1987

(Continued)

OTHER PUBLICATIONS

International Search Report, Written Opinion and Notice of Transmittal of Same mailed Apr. 16, 2010 for International Application PCT/US2009/062844 20 pages.

(Continued)

*Primary Examiner*—Jack Chiang
*Assistant Examiner*—Binh C Tat
(74) *Attorney, Agent, or Firm*—Mahamedi Paradice Kreisman LLP

(57) ABSTRACT

A substrate device is designed by identifying one or more criteria for handling of a transient electrical event on the substrate device. The one or more criteria may be based at least in part on an input provided from a designer. From the one or more criteria, one or more characteristics may be determined for integrating VSD material as a layer within or on at least a portion of the substrate device. The layer of VSD material may be positioned to protect one or more components of the substrate from the transient electrical condition.

7 Claims, 12 Drawing Sheets

U.S. PATENT DOCUMENTS

| | | | |
|---|---|---|---|
| 4,405,432 A | 9/1983 | Kosowsky | |
| 4,439,809 A | 3/1984 | Weight et al. | |
| 4,506,285 A | 3/1985 | Einzinger | |
| 4,591,411 A | 5/1986 | Reimann | |
| 4,642,160 A | 2/1987 | Burgess | |
| 4,702,860 A | 10/1987 | Kinderov et al. | |
| 4,726,877 A | 2/1988 | Fryd et al. | |
| 4,726,991 A | 2/1988 | Hyatt et al. | |
| 4,799,128 A | 1/1989 | Chen | |
| 4,888,574 A | 12/1989 | Rice et al. | |
| 4,892,776 A | 1/1990 | Rice | |
| 4,918,033 A | 4/1990 | Bartha et al. | |
| 4,928,199 A | 5/1990 | Diaz et al. | |
| 4,935,584 A | 6/1990 | Boggs | |
| 4,977,357 A | 12/1990 | Shrier | |
| 4,992,333 A | 2/1991 | Hyatt | |
| 4,996,945 A | 3/1991 | Dix, Jr. | |
| 5,068,634 A | 11/1991 | Shrier | |
| 5,092,032 A | 3/1992 | Murakami | |
| 5,095,626 A | 3/1992 | Kitamura et al. | |
| 5,099,380 A | 3/1992 | Childers et al. | |
| 5,142,263 A | 8/1992 | Childers et al. | |
| 5,148,355 A | 9/1992 | Lowe et al. | |
| 5,183,698 A | 2/1993 | Stephenson et al. | |
| 5,189,387 A | 2/1993 | Childers et al. | |
| 5,246,388 A | 9/1993 | Collins et al. | |
| 5,248,517 A | 9/1993 | Shrier et al. | |
| 5,252,195 A | 10/1993 | Kobayashi et al. | |
| 5,260,848 A | 11/1993 | Childers | |
| 5,262,754 A | 11/1993 | Collins | |
| 5,278,535 A | 1/1994 | Xu et al. | |
| 5,282,312 A | 2/1994 | DiStefano et al. | |
| 5,294,374 A | 3/1994 | Martinez et al. | |
| 5,295,297 A | 3/1994 | Kitamura et al. | |
| 5,300,208 A | 4/1994 | Angelopoulos et al. | |
| 5,317,801 A | 6/1994 | Tanaka et al. | |
| 5,340,641 A | 8/1994 | Xu | |
| 5,347,258 A | 9/1994 | Howard et al. | |
| 5,354,712 A | 10/1994 | Ho et al. | |
| 5,367,764 A | 11/1994 | DiStefano et al. | |
| 5,378,858 A | 1/1995 | Bruckner et al. | |
| 5,380,679 A | 1/1995 | Kano | |
| 5,393,597 A | 2/1995 | Childers et al. | |
| 5,403,208 A | 4/1995 | Felcman et al. | |
| 5,404,637 A | 4/1995 | Kawakami | |
| 5,413,694 A | 5/1995 | Dixon et al. | |
| 5,416,662 A | 5/1995 | Kurasawa et al. | |
| 5,440,075 A | 8/1995 | Kawakita et al. | |
| 5,444,593 A | 8/1995 | Allina | |
| 5,476,471 A | 12/1995 | Shifrin et al. | |
| 5,481,795 A | 1/1996 | Hatakeyama et al. | |
| 5,483,407 A | 1/1996 | Anastasio et al. | |
| 5,487,218 A | 1/1996 | Bhatt et al. | |
| 5,493,146 A | 2/1996 | Pramanik et al. | |
| 5,501,350 A | 3/1996 | Yoshida et al. | |
| 5,502,889 A | 4/1996 | Casson et al. | |
| 5,510,629 A | 4/1996 | Karpovich et al. | |
| 5,550,400 A | 8/1996 | Takagi et al. | |
| 5,557,136 A | 9/1996 | Gordon et al. | |
| 5,654,564 A | 8/1997 | Mohsen | |
| 5,669,381 A | 9/1997 | Hyatt | |
| 5,685,070 A | 11/1997 | Alpaugh et al. | |
| 5,708,298 A | 1/1998 | Masayuki et al. | |
| 5,714,794 A | 2/1998 | Tsuyama et al. | |
| 5,734,188 A | 3/1998 | Murata et al. | |
| 5,744,759 A | 4/1998 | Ameen et al. | |
| 5,781,395 A | 7/1998 | Hyatt | |
| 5,802,714 A | 9/1998 | Kobayashi et al. | |
| 5,807,509 A | 9/1998 | Shrier et al. | |
| 5,808,351 A | 9/1998 | Nathan et al. | |
| 5,834,160 A | 11/1998 | Ferry et al. | |
| 5,834,824 A | 11/1998 | Shepherd et al. | |
| 5,834,893 A | 11/1998 | Bulovic et al. | |
| 5,848,467 A | 12/1998 | Khandros et al. | |
| 5,856,910 A | 1/1999 | Yurchenko et al. | |
| 5,865,934 A | 2/1999 | Yamamoto et al. | |
| 5,869,869 A | 2/1999 | Hively | |
| 5,874,902 A | 2/1999 | Heinrich et al. | |
| 5,906,042 A | 5/1999 | Lan et al. | |
| 5,910,685 A | 6/1999 | Watanabe et al. | |
| 5,926,951 A | 7/1999 | Khandros et al. | |
| 5,940,683 A | 8/1999 | Holm et al. | |
| 5,946,555 A | 8/1999 | Crumly et al. | |
| 5,955,762 A | 9/1999 | Hivley | |
| 5,956,612 A | 9/1999 | Elliott et al. | |
| 5,962,815 A | 10/1999 | Lan et al. | |
| 5,970,321 A | 10/1999 | Hively | |
| 5,972,192 A | 10/1999 | Dubin et al. | |
| 5,977,489 A | 11/1999 | Crotzer et al. | |
| 6,013,358 A | 1/2000 | Winnett et al. | |
| 6,023,028 A | 2/2000 | Neuhalfen | |
| 6,064,094 A | 5/2000 | Intrater et al. | |
| 6,108,184 A | 8/2000 | Minervini et al. | |
| 6,130,459 A | 10/2000 | Intrater | |
| 6,160,695 A | 12/2000 | Winnett et al. | |
| 6,172,590 B1 | 1/2001 | Shrier et al. | |
| 6,184,280 B1 | 2/2001 | Shituba | |
| 6,191,928 B1 | 2/2001 | Rector et al. | |
| 6,198,392 B1 | 3/2001 | Hahn et al. | |
| 6,211,554 B1 | 4/2001 | Whitney | |
| 6,239,687 B1 | 5/2001 | Shrier et al. | |
| 6,251,513 B1 | 6/2001 | Rector et al. | |
| 6,310,752 B1 | 10/2001 | Shrier et al. | |
| 6,316,734 B1 | 11/2001 | Yang | |
| 6,340,789 B1 | 1/2002 | Petritsch et al. | |
| 6,351,011 B1 | 2/2002 | Whitney et al. | |
| 6,373,719 B1 | 4/2002 | Behling et al. | |
| 6,407,411 B1 | 6/2002 | Wojnarowski et al. | |
| 6,433,394 B1 | 8/2002 | Intrater | |
| 6,448,900 B1 | 9/2002 | Chen | |
| 6,455,916 B1 | 9/2002 | Robinson | |
| 6,512,458 B1 | 1/2003 | Kobayashi et al. | |
| 6,534,422 B1 | 3/2003 | Ichikawa et al. | |
| 6,542,065 B2 | 4/2003 | Shrier et al. | |
| 6,549,114 B2 | 4/2003 | Whitney et al. | |
| 6,570,765 B2 | 5/2003 | Behling et al. | |
| 6,593,597 B2 | 7/2003 | Sheu | |
| 6,628,498 B2 | 9/2003 | Whitney et al. | |
| 6,642,297 B1 | 11/2003 | Hyatt et al. | |
| 6,657,532 B1 | 12/2003 | Shrier et al. | |
| 6,693,508 B2 | 2/2004 | Whitney et al. | |
| 6,741,217 B2 | 5/2004 | Toncich et al. | |
| 6,797,145 B2 * | 9/2004 | Kosowsky | 205/221 |
| 6,882,051 B2 | 4/2005 | Majumdar et al. | |
| 6,911,676 B2 | 6/2005 | Yoo | |
| 6,916,872 B2 | 7/2005 | Yadav et al. | |
| 6,981,319 B2 | 1/2006 | Shrier | |
| 7,034,652 B2 | 4/2006 | Whitney et al. | |
| 7,049,926 B2 | 5/2006 | Shrier et al. | |
| 7,053,468 B2 * | 5/2006 | Lee | 257/668 |
| 7,064,353 B2 | 6/2006 | Bhat | |
| 7,132,922 B2 | 11/2006 | Harris et al. | |
| 7,141,184 B2 | 11/2006 | Chacko et al. | |
| 7,173,288 B2 | 2/2007 | Lee et al. | |
| 7,183,891 B2 | 2/2007 | Harris et al. | |
| 7,202,770 B2 | 4/2007 | Harris et al. | |
| 7,205,613 B2 | 4/2007 | Fjelstand et al. | |
| 7,218,492 B2 | 5/2007 | Shrier | |
| 7,320,762 B2 | 1/2008 | Greuter et al. | |
| 7,417,194 B2 | 8/2008 | Shrier | |
| 7,446,030 B2 * | 11/2008 | Kosowsky | 438/623 |
| 7,528,467 B2 | 5/2009 | Lee | |
| 2002/0061363 A1 | 5/2002 | Halas et al. | |
| 2003/0008989 A1 | 1/2003 | Gore et al. | |

| | | | |
|---|---|---|---|
| 2003/0010960 A1 | 1/2003 | Greuter et al. | |
| 2003/0079910 A1 | 5/2003 | Kosowsky | |
| 2003/0207978 A1 | 11/2003 | Yadav et al. | |
| 2004/0063294 A1 | 4/2004 | Durocher et al. | |
| 2004/0095658 A1 | 5/2004 | Buretea et al. | |
| 2004/0154828 A1 | 8/2004 | Moller et al. | |
| 2004/0160300 A1 | 8/2004 | Shrier | |
| 2004/0211942 A1 | 10/2004 | Clark et al. | |
| 2005/0026334 A1 | 2/2005 | Knall | |
| 2005/0083163 A1 | 4/2005 | Shrier | |
| 2005/0106098 A1 | 5/2005 | Tsang et al. | |
| 2005/0208304 A1 | 9/2005 | Collier et al. | |
| 2005/0218380 A1 | 10/2005 | Gramespacher et al. | |
| 2005/0274455 A1 | 12/2005 | Extrand | |
| 2005/0274956 A1 | 12/2005 | Bhat | |
| 2006/0035081 A1 | 2/2006 | Morita et al. | |
| 2006/0060880 A1 | 3/2006 | Lee et al. | |
| 2006/0152334 A1 | 7/2006 | Maercklein et al. | |
| 2006/0167139 A1 | 7/2006 | Nelson et al. | |
| 2006/0181826 A1 | 8/2006 | Dudnikov, Jr. et al. | |
| 2006/0181827 A1 | 8/2006 | Dudnikov, Jr. et al. | |
| 2006/0199390 A1 | 9/2006 | Dudnikov, Jr. et al. | |
| 2006/0211837 A1 | 9/2006 | Ko et al. | |
| 2006/0291127 A1 | 12/2006 | Kim et al. | |
| 2007/0114640 A1 | 5/2007 | Kosowsky | |
| 2007/0116976 A1 | 5/2007 | Tan et al. | |
| 2007/0126018 A1 | 6/2007 | Kosowsky | |
| 2007/0139848 A1 | 6/2007 | Harris et al. | |
| 2007/0146941 A1 | 6/2007 | Harris et al. | |
| 2007/0208243 A1 | 9/2007 | Gabriel et al. | |
| 2008/0023675 A1 | 1/2008 | Kosowsky | |
| 2008/0029405 A1 | 2/2008 | Kosowsky | |
| 2008/0032049 A1 | 2/2008 | Kosowsky | |
| 2008/0035370 A1 | 2/2008 | Kosowsky | |
| 2008/0045770 A1 | 2/2008 | Sigmund et al. | |
| 2008/0073114 A1 | 3/2008 | Kosowsky | |
| 2009/0044970 A1 | 2/2009 | Kosowsky | |
| 2009/0050856 A1 | 2/2009 | Kosowsky | |
| 2009/0212266 A1 | 8/2009 | Kosowsky | |
| 2009/0220771 A1 | 9/2009 | Fleming et al. | |
| 2009/0242855 A1 | 10/2009 | Fleming et al. | |
| 2009/0256669 A1 | 10/2009 | Kosowsky | |
| 2010/0047535 A1 | 2/2010 | Kosowsky et al. | |

FOREIGN PATENT DOCUMENTS

| | | |
|---|---|---|
| DE | 3040784 A1 | 5/1982 |
| DE | 10115333 A1 | 1/2002 |
| DE | 102004049053 A1 | 5/2005 |
| DE | 102006047377 A1 | 4/2008 |
| EP | 0 790 758 A1 | 8/1997 |
| EP | 1 003 229 A1 | 5/2000 |
| EP | 1 245 586 A2 | 10/2002 |
| EP | 1 580 809 A2 | 9/2005 |
| EP | 1542240 A2 | 6/2006 |
| EP | 1 857 871 A1 | 4/2007 |
| EP | 1 990 834 A2 | 11/2008 |
| JP | 56091464 A | 7/1981 |
| JP | 63 195275 A | 8/1988 |
| JP | 2000 062076 A | 2/2000 |
| WO | WO 88/00526 A1 | 1/1988 |
| WO | WO 96/02922 A2 | 2/1996 |
| WO | WO96/02924 A1 | 2/1996 |
| WO | WO 96/02944 A1 | 2/1996 |
| WO | WO97/26665 A1 | 7/1997 |
| WO | WO98/23018 A1 | 5/1998 |
| WO | WO99/24992 A1 | 5/1999 |
| WO | WO 99/49525 A1 | 9/1999 |
| WO | WO 02/103085 A1 | 12/2002 |
| WO | WO 2005/100426 A1 | 10/2005 |
| WO | WO 2006/130366 A2 | 12/2006 |
| WO | WO 2007/062170 A2 | 5/2007 |
| WO | WO 2007/062171 A2 | 5/2007 |
| WO | WO 2008/016858 A1 | 2/2008 |
| WO | WO 2008/016859 A1 | 2/2008 |
| WO | WO 2008/024207 A1 | 2/2008 |
| WO | WO 2008/036984 A2 | 3/2008 |
| WO | WO 2009/026299 A1 | 2/2009 |

OTHER PUBLICATIONS

International Search Report, Written Opinion and Notice of Transmittal of Same mailed Apr. 20, 2010 for International Application PCT/US2009/059134 22 pages.
U.S. Appl. No. 11/562,222, filed Nov. 21, 2006, Kosowsky.
U.S. Appl. No. 11/903,820, filed Sep. 24, 2007, Kosowsky et al.
U.S. Appl. No. 12/561,195, filed Sep. 16, 2009, Kosowsky et al.
U.S. Appl. No. 12/571,318, filed Sep. 30, 2009, Kosowsky et al.
U.S. Appl. No. 12/607,952, filed Oct. 28, 2009, Fleming et al.
U.S. Appl. No. 12/638,360, filed Dec. 15, 2009, Fleming et al.
U.S. Appl. No. 12/638,632, filed Dec. 15, 2009, Fleming et al.
U.S. Appl. No. 12/642,799, filed Dec. 19, 2009, Fleming et al.
U.S. Appl. No. 12/692,573, filed Jan. 22, 2010, Fleming et al.
U.S. Appl. No. 12/703,674, filed Feb. 10, 2010, Kosowsky et al.
U.S. Appl. No. 12/703,701, filed Feb. 10, 2010, Kosowsky et al.
U.S. Appl. No. 12/703,723, filed Feb. 10, 2010, Kosowsky et al.
U.S. Appl. No. 12/714,354, filed Feb. 26, 2010, Fleming et al.
U.S. Appl. No. 12/714,358, filed Feb. 26, 2010, Fleming et al.
U.S. Appl. No. 12/717,102, filed Mar. 3, 2010, Kosowsky et al.
U.S. Appl. No. 12/731,557, filed Mar. 25, 2010, Kosowsky.
Breton et al., "Mechanical properties of multiwall carbon nanotubes/epoxy composites: influence of network morphology," Carbon Elsevier UK, vol. 42, No. 5-6, pp. 1027-1030 (2004).
Communication of Nov. 11, 2009 with Examination Report in European Patent Application No. 07 813 509.2 5 pages.
Communication of Nov. 23, 2009 with Supp European Search Report and Opinion, European Application No. 06 838 319.9 7 pages.
Communication pf Nov. 9, 2009 with Examination Report in European Patent Application No. 07 813 508.4 5 pages.
Communication with Examination Report mailed Dec. 23, 2009 in European app. 06838276.1-2203, 6 pgs.
Fullerene Chemistry—Wikipedia, http://en.wikipedia.org/wiki/Fullerene/chemistry, 6 pages, printed Apr. 8, 2010.
Granstrom et al., "laminated fabrication of polymeric photovoltaic diodes," Nature, vol. 395, pp. 257-260 (1998).
Guo et al., "Block Copolymer Modified Novolac Epoxy Resin," Polymer Physics, vol. 41, No. 17, pp. 1994-2003 (2003).
International Preliminary Report on Patentability in International Application PCT/US2007/074677, Feb. 3, 2009, 8 pages.
International Preliminary Report on Patentability for International Application PCT/US06/045291, ISA/US, mailed Mar. 24, 2009, 8 pages.
International Preliminary Report on Patentability for International Application PCT/US07/079377 mailed Dec. 30, 2009, 8 pages.
International Preliminary Report on Patentability for International Application PCT/US2008/073603 mailed Mar. 4, 2010, 7 pages.
International Search Report and Written Opinion in International Application PCT/US2007/079345, mailed Nov. 7, 2008, 25 pages.
International Search Report and Written Opinion of the International Searching Authority in International Application PCT/US2008/073603, US Patent Office, Nov. 17, 2008, 7 pages.
International Search Report and Written Opinion of the International Searching Authority in International Application PCT/US09/040384, European Patent Office, Jul. 2, 2009, 15 pages.
International Search Report and Written Opinion in International Application PCT/US2009/038429 mailed Aug. 18, 2009, 20 pgs.
International Search Report and Written Opinion mailed Nov. 17, 2009 in International Application PCT/US2009/057209, 14 pages.
International Search Report, Written Opinion, and Notice of Transmittal of same mailed Mar. 18, 2010 for International Application PCT/US2010/021889 15 pages.
International Search Report and Written Opinion mailed Nov. 12, 2009 in International Application PCT/US2009/054062, 15 pages.
Levinson et al., "The Physics of metal oxide varistors," J. Applied Physics, 46(3): 1332-1341 (1975).

Non-Final Office Action mailed Apr. 20, 2010 in U.S. Appl. No. 11/829,946, 20 pages.

Non-Final Office Action dated Apr. 13, 2010 in U.S. Appl. No. 12/714,354, 17 pages.

Non-Final Office Action dated Apr. 13, 2010 in U.S. Appl. No. 12/714,358, 17 pages.

Notice of Allowance Jan. 14, 2010 U.S. Appl. No. 11/562,289 9pages.

Onoda et al., "Photoinduced Charge Transfer of Conducting Polymer Compositions," IEICE Trans. Electronics, vol. E81-C(7), pp. 1051-1056 (1998).

Raffaelle et al., "Nanomaterial Development for Polymeric Solar Cells," IEEE 4th World Conf on Photovoltaic energy Conversion, pp. 186-189 (2006).

Saunders et al., "Nanoparticle-polymer photovoltaic cells," Adv. Colloid Int. Sci., vol. 138, No. 1, pp. 1-23 (2007).

Celzard, A., et al., "Conduction Mechanisms in Some Graphite-polymer Composites: The Effect of a Direct-current Electric Field", Journal of Physics: Condensed Matter, 9 (1997) pp. 2225-2237.

International Search Report and Written Opinion of the International Searching Authority in International Application PCT/US06/45291, United States Patent Office, Mar. 5, 2008, 14 pages.

International Search Report and Written Opinion of the International Searching Authority in International Application PCT/US06/45292, United States Patent Office, Feb. 14, 2008, 10 pages.

International Search Report and Written Opinion of the International Searching Authority in International Application PCT/US2007/079377, European Patent Office, Mar. 7, 2008, 13 pages.

International Search Report and Written Opinion of the International Searching Authority in International Application PCT/US2007/074677, European Patent Office, Dec. 5, 2007, 13 pages.

Modine, F.A. and Hyatt, H.M. "New Varistor Material", Journal of Applied Physics, 64 (8), Oct. 15, 1988, pp. 4229-4232.

Facchetti, Antonio, "Semiconductors for Organic Transistors", Materials Today, vol. 10, No. 3, pp. 28-37, Mar. 2007.

Reese, Colin and Bao, Zhenan, "Organic Single-Crystal Field-Effect Transistors", Materials Today, vol. 10, No. 3, pp. 20-27, Mar. 2007.

* cited by examiner

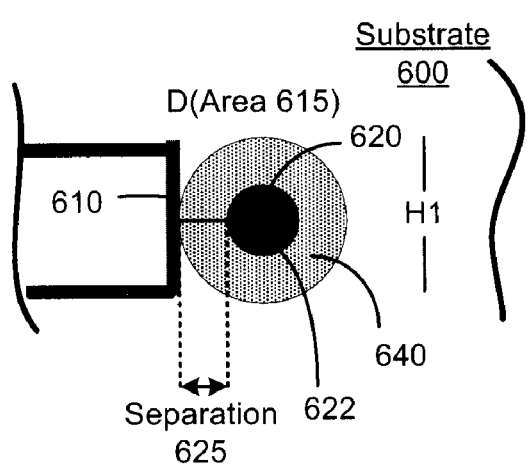
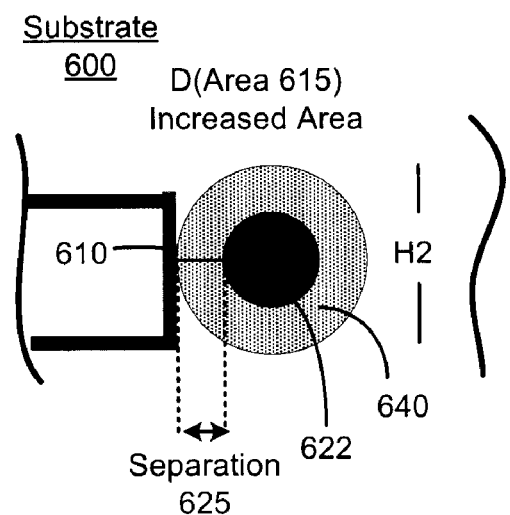
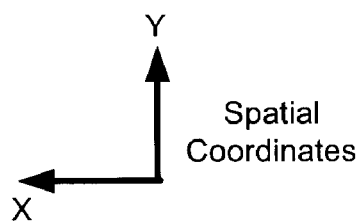
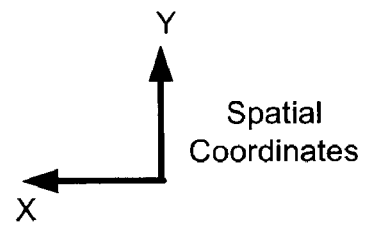
FIG. 6A  FIG. 6B

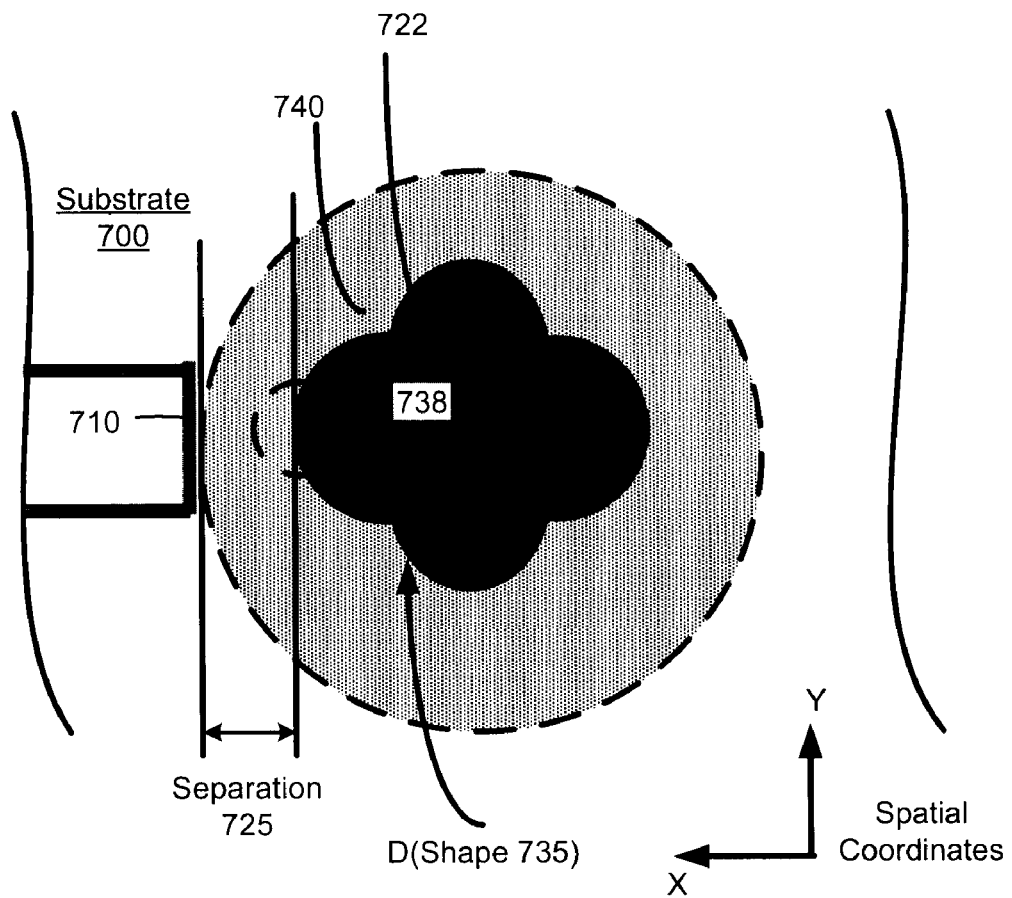
FIG. 7
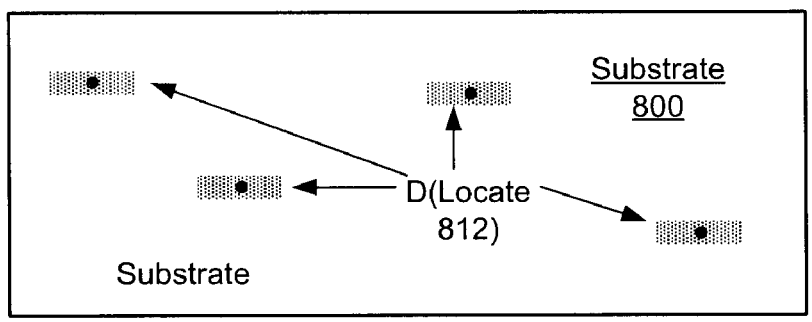
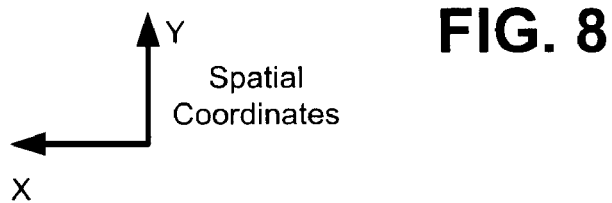
FIG. 8

SYSTEM AND METHOD FOR INCLUDING PROTECTIVE VOLTAGE SWITCHABLE DIELECTRIC MATERIAL IN THE DESIGN OR SIMULATION OF SUBSTRATE DEVICES

RELATED APPLICATIONS

This application claims benefit of priority to Provisional U.S. Patent Application No. 60/943,556, entitled SYSTEM AND METHOD FOR PROGRAMMATICALLY DESIGNING ELECTRONIC DEVICES USING VOLTAGE SWITCHABLE DIELECTRIC MATERIAL, filed Jun. 13, 2007; the aforementioned priority application being hereby incorporated by reference in its entirety.

TECHNICAL FIELD

Embodiments described herein pertain to design or simulation of electrical devices. In particular, embodiments described herein pertain to a system and method for including protective voltage switchable dielectric material in the design or simulation of substrates and other electrical devices.

BACKGROUND

Electronic Design Automation software and similar programmatic tools enable the design and/or simulation of components on electronic devices. Examples of such devices include printed circuit boards (PCBs) and integrated circuit or semiconductor packages. Typical functionality provided with such tools include schematic entry, behavioral modeling, circuit simulation, full custom layout, physical verification, extraction and back-annotation. Used mainly for analog, mixed-signal, radio-frequency communication components ("RF"), and standard-cell or memory designs. EDA software may also be used for functions such as (i) create integrated circuit devices, including testing and placing and routing of such devices; (ii) simulate function verification.

BRIEF DESCRIPTION OF THE DRAWINGS

Embodiments described herein may be referenced to anyone or more of the following figures.

FIG. 6A and FIG. 6B are top views of a substrate illustrating the implementation of area considerations for VSD material, according to an embodiment of the invention.

FIG. 7 illustrates the use of shape as another spatial implementation detail for the integration of VSD material on a substrate or other device during a design or simulation phase, under an embodiment of the invention.

FIG. 8 illustrates an embodiment in which the implementation details include the determination of some or all of the locations where VSD formations are to provide transient connections to a protective electrical path, under an embodiment of the invention.

DETAILED DESCRIPTION

Figure 1:
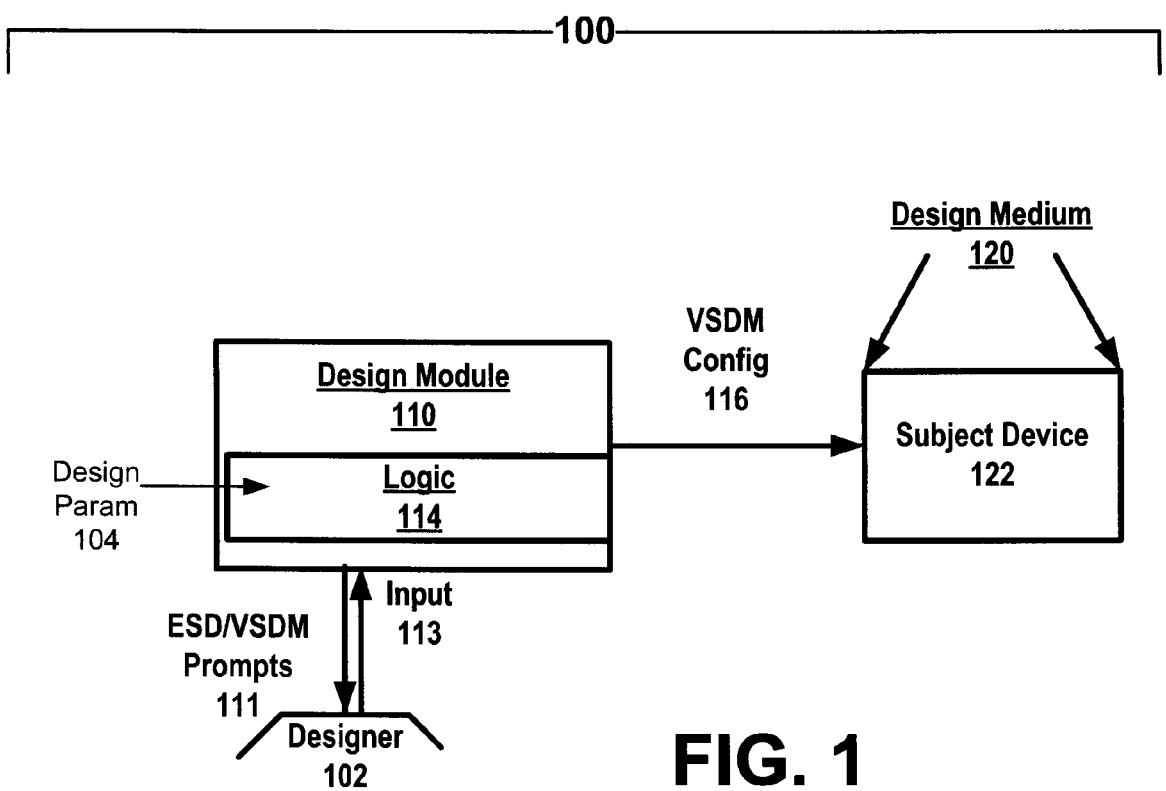
FIG. 1 is a simplified diagram of a system for designing integrated circuit devices using voltage switchable dielectric material (VSD material), according to an embodiment of the invention.

Embodiments described herein provide for programmatic design or simulation of substrates carrying electrical elements to integrate voltage switchable dielectric ("VSD") material as a protective feature. In particular, VSD material may be incorporated into the design of a substrate device for purpose of providing protection against transient electrical conditions, such as electrostatic discharge (ESD). In this respect, embodiments described herein may be used as part of a computer system or programmatic process for designing and/or simulating substrate devices. As an example, one or more embodiments may be implemented as part of an Electronic Design Automation (EDA) program, which are normally used to design and produce electronic devices and systems, including printed circuit board (PCBs), display devices and backplanes, integrated circuit devices, semiconductor components and devices.

Generally, VSD material refers to material that exhibits the property of (i) acting as a dielectric in the absence of some threshold voltage or energy that is significant in the context or environment where the VSD material is provided, (ii) becomes conductive when applied a voltage that is in excess of a threshold voltage level. The threshold voltage level may vary for different kinds of VSD materials, but it generally exceeds the operational voltage of the surrounding environment of the VSD material. As a result of this switching property, VSD material can be positioned to form transient electrical connections that can protect against transient electrical events, most notably electrostatic discharge (ESD).

Embodiments described herein recognize that an ESD event typically ranges from a few hundred volts to tens of thousands of volts, with peak amperages of a few amps to tens of amps. ESD events are both high wattage (product of volts and current) and low energy events (as energy is a product of volts current and duration), since an ESD event only lasts from picoseconds to a few nanoseconds. When a VSD material is triggered to the "on" state with a high voltage pulse, current begins to flow through the thickness of the material.

Some devices or structures are capable of handling ESD events by including a layer of VSD material within or on a thickness of the device. Conventional approaches provide for depositing VSD material to occupy a layer within a thickness of a printed circuit board. Such a layer may be tied to various electrical leads or current carrying elements through vias as conductive elements. U.S. Pat. No. 6,797,145 (hereby incorporated by reference in its entirety) describes a technique for implementing VSD material within a current carrying structure in a manner that enables the VSD material to be used to plate the conductive element. Such plating techniques may also enable the device to have some capabilities for handling ESD events.

Numerous examples of VSD material exist, including those described in U.S. patent application Ser. No. 11/881, 896 and U.S. patent application Ser. No. 11/829,951, both of which are incorporated by reference in their respective entirety. VSD material may also include commercially available products sold under the name "SURGX", manufactured by the SURGX CORPORATION (which is owned by LITTLEFUSE INC.). VSD material can further be characterized as a material having non-linear resistance.

Moreover, according to one or more embodiments, the VSD material has a characteristic of being uniform in its composition, while exhibiting electrical characteristics as stated. In such an embodiment, the VSD material is comprised of a matrix or binder that contains conductive and/or semi-conductive material that is substantially uniformly distributed.

As used here, "design phase" or "simulation phase" of a substrate or other device refers to data representations of such substrates and devices.

In the description and examples provided, the characteristic voltage level and the threshold values are assumed values, determined from experimental conditions that can be affected by numerous variables. As such, the values described in this application should not be considered physical certainties, like would be the case for the property of density.

Embodiments described herein provide for a system or method for design or simulation of a substrate device. Specifically, numerous embodiments described herein exist, or are otherwise implemented, in the context of a design or simulation phase of a substrate device. In a design or simulation phase, no actual substrate device is necessary for practicing one or more embodiments described herein. Rather, embodiments that are described herein in the context of a design or simulation phase may use data representations of substrate devices, VSD material, components and elements of the substrate device, and the behavior of the components/elements/VSD material under various conditions.

In one embodiment, a substrate device is designed by identifying one or more criteria for the handling of a transient electrical event on the substrate device. The one or more criteria may be based at least in part on an input provided from a designer. From the one or more criteria, one or more characteristics may be determined for integrating VSD material as a layer within or on at least a portion of the substrate device. The layer of VSD material may be positioned to protect one or more components of the substrate from the transient electrical condition.

In another embodiment, a system is provided for manufacturing a substrate device (rather than a system for design or simulation apart from manufacture). The system may include an interface, a memory resource and a processing resource. The interface receives one or more criteria from a designer. The memory resource stores information about the substrate and/or various types of VSD material. The processing resource may be configured to use the input and the information stored in the memory to: (i) identify one or more criteria for handling of a transient electrical event on the substrate device; and (ii) determine, from the one or more criteria, one or more characteristics for integrating VSD material as a layer within or on at least a portion of the substrate device. The layer of VSD material is positioned to protect one or more components of the substrate from the transient electrical condition.

Still further, an embodiment provides for designing a substrate device during a design or simulation phase. Responsive to an interaction with a designer, a plurality of locations are selected on a substrate device that are to provide a protective electrical path when the transient electrical event occurs. At each of the plurality of locations, a dimension of a layer of a VSD material is determined at the selected location. The dimension of the layer of VSD material is selected based at least in part on a threshold measure of energy that is required to cause the layer of VSD material to switch from a dielectric state into a conductive state. When the VSD material is in the conductive state, the VSD material interconnects one or more components to the protective electrical path.

Another embodiment provides for determining a spacing of one or more electrical components that are to be connectable on a substrate device. In an embodiment, one or more electrical tolerances are identified for an electrical component that is to be protected against transient electrical events by a protective electrical path. A layer of VSD material may be identified that is to provide a gap separation between the electrical component and the protective electrical path. The VSD material is capable of switching from a dielectric state into a conductive state with application of a measure of energy that exceeds a threshold level, and the threshold level may be dependent at least in part on a dimension of the VSD material. In an embodiment, the gap separation is sized or dimensioned so that the threshold level for the measure of energy that causes the VSD material to switch is less than the one or more tolerances of the electrical component.

According to another embodiment, a system is provided for enabling design or simulation of at least a portion of a substrate device. The system includes a data store and a configuration module. The data store maintains data that references a first entry representing a first type of VSD material with one or more properties of the first VSD material. The one or more properties of the first VSD material may include a value representing a characteristic voltage per designated length. The characteristic voltage per designated length may correspond to a known or designated voltage level value that, when applied across a designated length of the first VSD material, causes the first VSD material to switch from a dielectric state into a conductive state. The configuration module determines, from one or more interactions with a designer of the system, (i) one or more dimensional parameters that are based on spatial constraints of the portion or of the substrate, and (ii) a voltage level that is tolerable by one or more electrical components that are to be protected in the portion of the substrate device. The configuration module may be configured to determine a gap separation that (i) is to be provided by a layer of the first VSD material on at least the portion of the substrate, and (ii) is to separate at least one electrical component from a protective electrical path on the substrate for transient events. Additionally, the configuration module determines the gap separation based at least in part on determining (i) a threshold voltage level that will likely cause the first VSD material to switch into the conductive state (ii) based on the characteristic voltage per designated length and a size of the gap separation. The configuration module may further ensure that the threshold voltage level is less than the tolerable voltage level of the one or more electrical components.

An embodiment further includes an optimization system for enabling design or simulation of at least a portion of a substrate device. The system includes a data store, a configuration module, and an optimization component. The data store maintains information about a plurality of types of VSD materials. The information may include a characteristic voltage per designated length for each of one or more types of VSD materials. The characteristic voltage per designated length may correspond to a voltage level applied across a designated length of a particular type of VSD material that is likely to trigger the VSD material of the type to switch from being in a dielectric state to being in a conductive state. The configuration module may be configured to determine, from one or more interactions with a designer of the system, (i) one or more dimensional parameters that are based on spatial constraints of the portion or of the substrate, and (ii) a voltage level that is tolerable by one or more electrical elements that are to be protected in the portion of the substrate device. The configuration module is configured to determine, for any of the plurality of types of VSD materials, a gap separation that (i) is to be occupied by that type of VSD material on at least the portion of the substrate, and (ii) is to separate at least one electrical element from a protective electrical path for transient events. The configuration module is further configured to determine, for any one of the plurality of types of VSD material, the gap separation needed for using a layer of that VSD material to separate the at least one electrical element from the protective electrical path. The optimization component is configured to make a selection of at least one of (i) a selected type of VSD material from the plurality of types of VSD material, or (ii) a size of the gap separation for the selected type of VSD material. The optimization component may also be configured to make the selection based on one or more optimization criteria.

Still further, one or more embodiments include a system for optimizing application of VSD material on a substrate device. The system includes an interface, a memory resource, and a processing resource. The interface may be configured to receive one or more criteria from a designer of the substrate device. The memory resource stores information about at least one of the substrate or of various types of VSD material. The processing resource is coupled to the interface and to the memory resource, and is configured to use the input and the information stored in the memory to (i) identify one or more criteria for handling of a transient electrical event on the substrate device; and (ii) determine, from the one or more criteria, one or more characteristics for integrating VSD material as a layer within or on at least a portion of the substrate device. The layer of VSD material may be positioned to protect one or more components of the substrate from the transient electrical condition. One or more optimization criteria are identified for integrating VSD material onto some or all of the substrate.

Additionally, an embodiment includes a data system. The data system may be used for applications that include enabling design or simulation of a substrate device. The data system includes a data store that is accessible to a configuration module for integrating VSD material into a substrate device. The data store maintains a plurality of entries, and each entry (i) identifies a type of VSD material, and (ii) includes data that identifies one or more electrical characteristics of the type of VSD material that are pertinent to integration of that type of VSD material into the substrate device. The one or more electrical characteristics of the type of VSD material may include any one or more of: (i) a characteristic measurement of energy that, when applied to a designated measurement of the type of VSD material, is likely to cause the VSD material of the type to switch from a dielectric state to being in a conductive state, (ii) a leakage current associated with the type of VSD material; or (iii) an off-state resistance associated with the type of VSD material.

As provided below, numerous other embodiments are described. Additional embodiments may also combine features of multiple different embodiments even though such combinations are not expressly stated in this application.

Embodiments described herein provide that methods, techniques and actions performed by a computing device are performed programmatically, or as a computer-implemented method. Programmatically means through the use of code, or computer-executable instructions. A programmatically performed step may or may not be automatic.

One or more embodiments described herein may be implemented through the use of modules or components. A module or component may include a program, a subroutine, a portion of a program, or a software component or a hardware component capable of performing one or more stated tasks or functions. As used herein, a module or component can exist on a hardware component independently of other modules/components, or a module or component can be a shared element or process of other modules, programs or machines.

Furthermore, one or more embodiments described herein may be implemented through the use of instructions that are executable by one or more processors. These instructions may be carried on a computer-readable medium. Machines shown in figures below provide examples of processing resources and computer-readable mediums on which instructions for implementing embodiments of the invention can be carried and/or executed. In particular, the numerous machines shown with embodiments of the invention include processor(s) and various forms of memory for holding data and instructions. Examples of computer-readable mediums include permanent memory storage devices, such as hard drives on personal computers or servers. Other examples of computer storage mediums include portable storage devices, such as CD or DVD devices, flash memory (such as carried on many cell phones and personal digital assistants (PDAs)), and magnetic memory. Computers, terminals, network enabled devices (e.g. mobile devices such as cell phones) are all examples of machines and devices that utilize processors, memory, and instructions stored on computer-readable mediums.

Application of VSD Material on Substrate Device

FIG. 1 is a simplified diagram of a system for designing integrated circuit devices using voltage switchable dielectric material (VSD material), according to an embodiment of the invention. A system 100 for designing electronic devices may be implemented in the context of creating a new electronic device (such as an integrated circuit device or printed circuit board) in combination with a manufacturing or production process, and/or simulating or testing operations of a layout or construct of the device. Examples of devices that may be produced and/or simulated with embodiments described herein include printed circuit boards, wafers and chips, semiconductor packaging substrate, display devices and backplanes, and other circuit devices or hardware (collectively "subject device"). In addition to substrate-class of internal devices, embodiments may also be used to design various electrical and protective features on more integrated or completed devices, such as electronic handheld devices (such as cell phones or electronic paper). For example, one or more embodiments enable the design of a housing of a cell phone or device carrying trace elements and/or integrated logic. Thus, the term "device" is intended to include substrate devices, including internal components that carry or provide hardware and logic, as well as completed or partially formed devices that may include designed electrical elements while being in a stage of being functional or near functional. For example, the term device may include products that may integrate electrical elements and/or logic in a finished housing or structure.

With reference to an embodiment of FIG. 1, system 100 may include a design module 110 for creating a design layout for the subject device 122. A designer 102 may interface and operate the design module 110 to specify or configure layout and/or design information of the subject device 122. In one implementation, design module 110 corresponds to software design application that can be operated by a designer through use of a computer terminal. For example, the software design application may correspond to an electronic design automation (EDA) package, such as manufactured by Cadence System designs, Inc. or Mentor Graphics.

The designer 102 may implement various kinds of information in the design module 110, including circuit layout, components, design parameters, and/or performance criteria. These specifications enable the subject device 122 to be designed, simulated and optionally produced in a design medium 120. As such, the design medium 120 may be virtual or simulated, or alternatively actual or real. The simulated or virtual design medium may correspond to a computer-implemented environment that enables, for example, simulation or testing of a subject device 122. As embodiments such as described pertain to design or simulation, device 122 may include data representations of actual physical devices. A real design medium may include the use of manufacturing, production and/or other implementation equipment and processes for implementing designs generated from module 110 onto the subject device 122 production.

In one embodiment, design module 110 includes logic 114 for determining and automating application of VSD material onto the subject device 122. Logic 114 may be responsive to design and/or performance parameters 104 specified by the designer 102 and/or obtained from other sources. The application of VSD material may include an initial determination as to whether VSD material is to be used. In one embodiment, an initial determination is made as to whether a board or base element of the subject device 122 is to include VSD material. For example, the user may simply select a substrate for the design that has embedded within it a layer of VSD material. If VSD material is to be included, VSD material application logic 114 may use various prompts and/or design ("VSD material configurations 116") specifications to determine how VSD material is to be applied on the subject device 122.

In an embodiment, the design module 110 may provide an initial prompt 111 or interface to enable the designer 102 to elect (explicitly or implicitly) to have the VSD material included in the subject device 122. The module 110 may also provide one or more subsequent prompts 111 or interfaces to determine specifics about the device under design, including tolerance levels of individual elements on the substrate, spatial constraints, and device type. In one embodiment, all of the information used in determining a configuration for the VSD material is inferred. For example, user input pertaining to voltage tolerances of individual components or elements of a device under design may be used to programmatically determine at least some of the VSD configuration information, such as, for example, the type of VSD material used and one or more spatial characteristics of the VSD material (e.g. gap separation or shape, as described below). In another embodiment, some of VSD configurations may be determined from user-input that directly pertains to the VSD material. The responses to the prompts 111 may be provided by inputs 113 of the designer 102. The additional VSD material configurations 116 may, for example, specify location of the VSD material, and material composition of the VSD material or other factors that may affect the performance of the VSD material in the presence of an ESD event. Under one embodiment, the presence and specification of the VSD material may be tied to the ESD characteristics desired from the subject device 122.

Figure 2A:
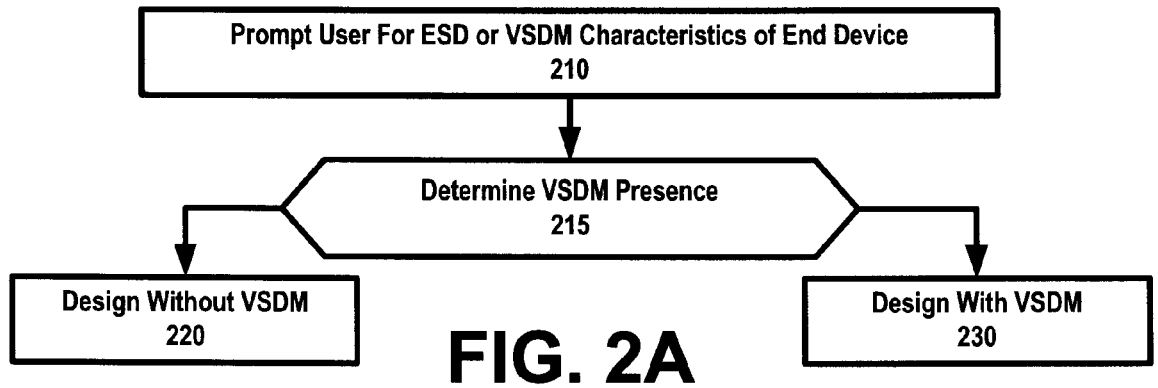
FIG. 2A and FIG. 2B each illustrate a method for designing or simulating the application of VSD material onto the subject device, according to an embodiment of the invention.
Figure 2B:
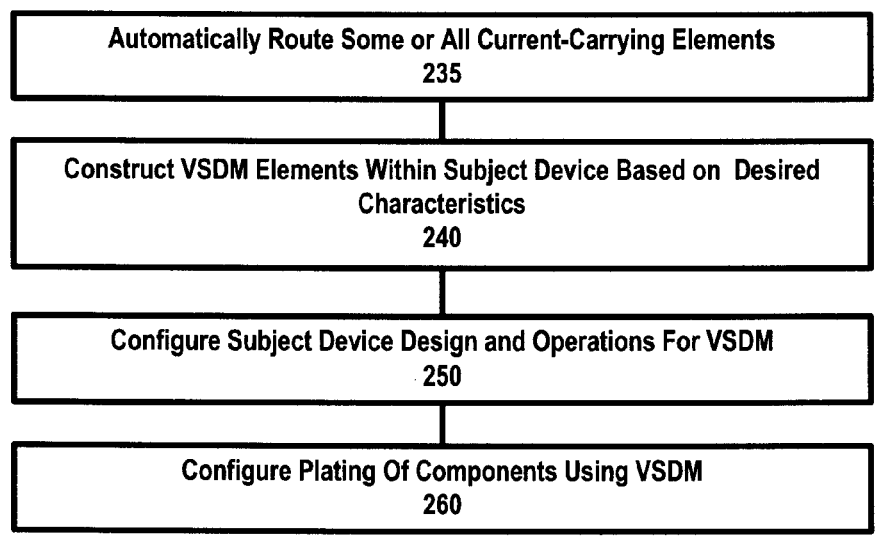

FIG. 2A and FIG. 2B each illustrate a method for designing or simulating the application of VSD material onto the subject device, according to an embodiment of the invention. In describing the different methodologies, reference is made to elements of FIG. 1 for purpose of describing elements that may be suitable for performing a step or sub-step. A method or methods such as described may be performed programmatically, such as through an EDA application installed and made operation on a terminal.

In step 210, the design module 110 prompts the user for information that is directly or indirectly related to the application of VSD material on the subject device 122. In one embodiment, the prompts include an initial prompt as to whether the designer wishes to include VSD material and/or its protective functionality on the substrate. As an alternative or variation, the designer may also be prompted for one or more of the following: (i) for desired ESD characteristics or types of electrical events that are to be protected, (ii) optimization parameters, such as cost or priority in spatial constraints, (iii) regional input affecting location where VSD material is to be provided. The prompts listed are not intended to be exhaustive, but numerous other prompts may also be included. In one implementation, the prompts may be in the form of questions that direct the user to enter the desired characteristics. As another implementation, the prompts may be provided in the form of presentation of graphical menus or other graphical features or options that enable the user to specify design choices (such as relating to ESD handling capabilities).

Based on information provided by the user, a determination is made in step 215 as to whether VSD material is to be present on the subject device 122. In one implementation, the determination is as simple as the user electing to have VSD material and/or material protection against ESD and/or other transient events. In another implementation, the determination may be programmatically inferred from, for example, input from the designer specifying desired characteristics of the subject device 122 and how the subject device 122 is to handle ESD (e.g. tolerance voltage levels).

If the VSD material is not necessary, step 220 provides that the design of the subject device 122 is carried forward without use of VSD material. If the VSD material is deemed necessary, step 230 provides that the design of the subject device 122 is carried forward with VSD material integrated in the construct or thickness of the device. In one embodiment, for example, the application or program performing the method selects a substrate that has VSD material integrated as an internal or surface layer within the substrate.

FIG. 2B illustrates additional steps that may be optionally performed as part of or subsequent to step 230, in which a determination has been made to include VSD material in the design or simulation of a substrate. In a step 235, some or all of the layout or routing of current-carrying elements or devices is determined and/or implemented automatically. Step 235 may include automatically performing one or more of the following, based on the determination that VSD material is to be present on the device 122: (i) routing the board of current carrying traces, elements and devices, (ii) determining desired impedance and/or capacitance values of select elements on the subject device 122 in routing the elements, (iii) preserving signal integrity and characteristics in performing the routing.

As an addition or alternative to routing the board, components of the subject device 122 may be selected. In one embodiment, step 235 may thus provide full or partial automation of routing or otherwise implementing a design of the subject device 122, based on the determination that the device is to inherently include a layer of VSD material, such as in the form of a layer of VSD material in a thickness of a substrate of the subject device 122.

Still further, as another alternative or addition to step 235, step 240 may enable the designer 102 to enter information regarding desired performance parameters, material strength and/or components that are to be used on the subject device. Based on such information, step 240 configures or constructs VSD material elements within the subject device 122. In one implementation, the material composition of the VSD material may be set by the material properties of the subject device 122. For example, the pliability or strength of the board or its components may determine the composition, thickness and location of the VSD material. Likewise, performance parameters such as switching voltage (as provided by characteristic voltage per designated length) may affect the type and/or thickness of VSD material used, or the manner in which VSD material is used to plate vias or other conductive areas of the subject device 122. In this way, the application of VSD material is based on information provided by the user relating to desired characteristics of (i) the subject device 122 and/or (ii) how the subject device handles the ESD events.

VSD Material Configuration During Design Phase

Figures 3A, 3B:
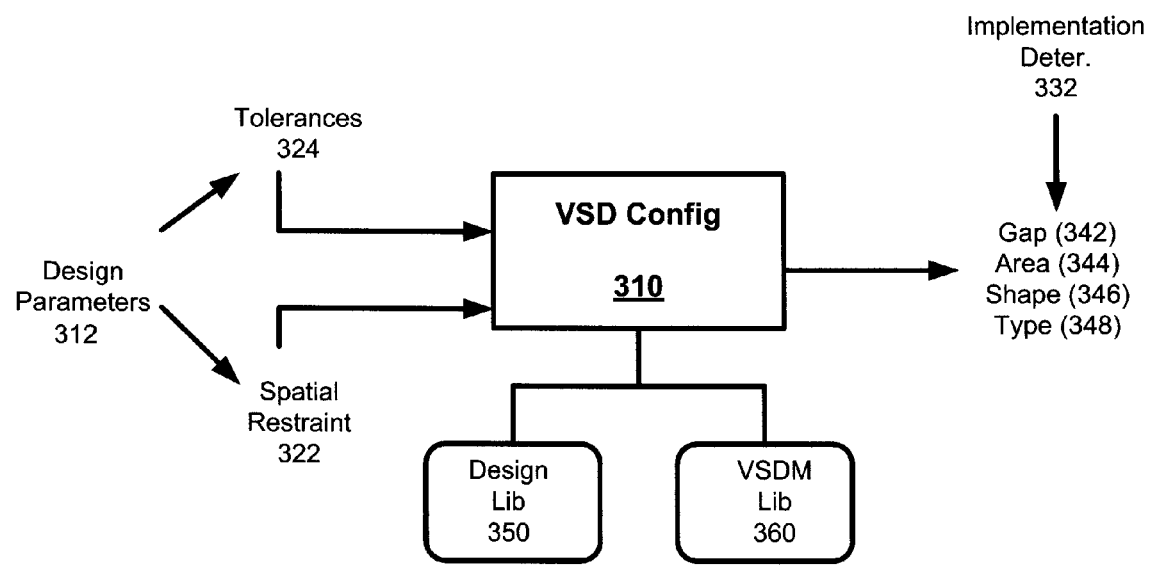
FIG. 3A is a simplified block diagram illustrating the manner in which VSD material may be incorporated into a substrate, according to one or more embodiments of the invention.
FIG. 3B illustrates a data structure that may be maintained by the VSD material library, under an embodiment of the invention.

As an addition or alternative to embodiments such as described above, one or more embodiments described herein provide for the design or simulation of a substrate to incorporate programmatic selection or design of specific characteristics (under design or simulation) of the VSD material, including both localized and substrate-level characteristics. FIG. 3A is a simplified block diagram illustrating the manner in which VSD material may be incorporated or integrated into a substrate device, according to one or more embodiments of the invention. In an embodiment, a configuration component for implementing VSD material during design or simulation of a substrate is provided as VSD configuration module 310. The VSD configuration module 310 may form, for example, a program or a portion thereof. Alternatively, the VSD configuration module 310 may provided by multiple programs or program portions, whether independent or integrated with one another. More specifically, VSD configuration module 310 may correspond or include the logic 114 of the design module described with one or more embodiments of FIG. 1. As will be described, the VSD configuration module 310 may be used in connection with a design library 350 and/or VSD material library 360. In one implementation, each library may be provided in the form of a data store, retaining data and information that corresponds to a set of instructions or data, distributed in multiple sources or maintained in one location (e.g. such as in one file).

In general, embodiments described herein recognize that VSD material may be of various types in that numerous compositions of the material are possible. The composition of the VSD material affects electrical and physical properties of the VSD material. Some of the pertinent electrical properties of the VSD material include the characteristic voltage or energy levels by which a specific type or composition of VSD material switches on (i.e. switch from being dielectric to being conductive).

The characteristic energy level indicates a measure of energy needed in order to switch-on a given amount of VSD material of a particular type. As the ability for VSD material to switch on generally lasts a short time period, the amount of energy required to switch VSD material into the conductive state may be represented by the characteristic energy level. The characteristic energy level for a given type of VSD material generally corresponds to some form of energy (such as voltage) that can be applied to a designated measurement of VSD material in order to switch the VSD material into the conductive state. The designated measurement of VSD material may correspond to a linear dimension of VSD, corresponding to a gap or separation distance between two conductive elements that are to be connected when the VSD material switches on. While the form of energy may be expressed as current, power or electric field, embodiments described herein primarily refer to the characteristic energy level has being in the form of an applied voltage. It should be apparent, however, that use of applied voltage may readily be substituted for other forms of energy, such as current or power. The use of applied voltage as the form of energy that defines the characteristic energy level and the behavior of the VSD material under transient and operating conditions is a matter of choice, as simple relationships can substitute voltage for other forms of energy. For example, the application of Ohms law (which may be strictly applied only at a limited range of voltage values, given non-linear resistive nature of VSD material) may enable identification of a characteristic current from the characteristic voltage.

In the description provided herein, the "characteristic energy level" is represented through voltage (i.e. the "characteristic voltage level"). The "characteristic voltage level" is (i) specific to a particular type of VSD material, and (ii) is known with some degree of certainty to cause a designated measurement of the particular type of VSD material to switch from being dielectric to being conductive. Unless stated otherwise, the characteristic voltage level is a voltage that is applied over a designated length of VSD material and is known to cause the amount of VSD material occupying that length to switch into a conductive state. As stated previously, the use of voltage as the form of energy may be substituted for other forms of energy, such as current, power, or electric field.

A "threshold energy level" represents an amount of applied energy for switching the VSD material into an on-state. When the applied energy is expressed as voltage, a "threshold voltage level" or "on-voltage" refers to the voltage level that is needed to switch a particular quantity of VSD material into a conductive state. In many cases, the threshold voltage level can be assumed to be a product value of the characteristic voltage level per designated length multiplied by the length of VSD material that is present.

More specifically, the characteristic energy level includes elements of a trigger and a clamp. A trigger energy level is an initial energy level that initiates the material to switch from being dielectric to being conductive. The clamp energy level is the energy level that needs to be maintained in order to maintain the VSD material in an "on-state". When expressed as voltage, both the trigger voltage and clamp voltage provide a measure of energy that can be applied in a given duration to effect the switch in the electrical characteristics of the material. Even though the length of time that the VSD material can remain on is brief, in some cases, the application of energy as measured from the trigger voltage may be compensated for by time. In at least some scenarios, the trigger voltage may be reduced or compensated for with a lesser voltage that exceeds the clamp voltage and lasts a sufficient duration. In most cases, the occurrence of a voltage exceeding the clamp voltage is a requirement for switching the VSD material on. However, the trigger voltage does not always have to be matched in order to switch the VSD material on. As such, unless stated otherwise, embodiments described herein which reference a characteristic voltage level (per designated length) of VSD material should be assumed to reference the clamp voltage.

Another electrical characteristic of VSD material for consideration is a measurement of leakage current, or alternatively, off-state resistivity. In general, leakage current is undesirable, but can be tolerated. Different types of VSD material have varying leakage current rates. Moreover, leakage current characteristics of VSD material (or alternatively the off-state resistance) may fluctuate with other factors, including operational voltage. Thus, the environment for use of the VSD material, and more specifically, the operational voltage, may also be a consideration when VSD material is analyzed or otherwise considered for design.

For any given type of VSD material, both the threshold voltage (needed to switch the material "on") and the leakage current are or affected by the effective amount of material present at a relevant location (i.e. between two conductive paths). The effective amount of material may be measured linearly, by area or by volume. In general, the greater a linear length of VSD material in use (alternatively termed the gap separation or gap value), (i) the greater the threshold voltage level needed to switch the material on, and (ii) the lesser the amount of leakage current present (or conversely the higher the off-state resistance). As a matter of reference, the characteristic voltage level and leakage current values for VSD material may be specified by a designated length.

The amount of area or volume of VSD material at a relevant location between two conductive points may also be pertinent to electrical properties that are to be present between the two conductive points. For example, in come cases, the volume occupied by VSD material in providing the transient connection may increase leakage current.

Embodiments described herein recognize that during design or simulation of a substrate device or other electrical component, the VSD material may be selectively positioned to form a transient connection between a conductive path and a protective electrical path (e.g. such as a ground). A designer of the substrate or electrical device may specify design criteria for the transient connection, that explicitly or implicitly results in a determination of one or more of the following: (i) at what voltage level should the connection be switched on (i.e. the threshold voltage level); (ii) how much leakage current is acceptable at the connection, considering tolerance levels of surrounding components; (iii) how much space is available for the transient connection.

In the application of VSD material to accommodate a given design criteria, the following determinations may then be made: (i) the type of VSD material that is to be used, as the type affects desired electrical characteristics; and/or (ii) the gap separation distance that the VSD material is to occupy in forming the transient connection. One or more embodiments may also consider the area and volume (i.e. thickness and area) that the VSD material is to occupy in providing the separation and transient connection between two conductive elements.

Under an embodiment, VSD configuration module 310 implements the various considerations and principles described for integrating VSD material onto a substrate as part of a transient protective connection. As described, the considerations and principles for implementing VSD material may require determination of parameters relating to spatial restraints of the device or area where VSD material to be present, tolerance levels of components and elements that surround or may use the VSD material, and transient level requirements (e.g. desired level of ESD protection) of the device or elements that are to be protected. With reference to an embodiment of FIG. 3A, the parameters are collectively referred to as design parameters 312. VSD configuration module 310 uses design parameters 312 to determine specifics about how the VSD material is to be integrated or included on the device of the design. These determinations may correspond to, for example, (i) the gap or separation formed by the VSD material between an element that is to be protected and a protective electrical path; and (ii) the type of VSD material that is to be used. Under one embodiment, additional determinations may include (iii) an area that the VSD material is to occupy when separating the element that is to be protected from the protective electrical path, and (iv) shape considerations which may affect the area. Still further, other determinations that may be made include those of the volume that is to be occupied by the VSD material in providing the separation. With reference to FIG. 3A, these determinations may collectively be referenced as the VSD implementation determinations 332. As described below, the VSD implementation determination 332 may be based on user-input or design rules of the particular substrate device application.

In an embodiment of FIG. 3A, VSD configuration module 310 incorporates information, data, and/or rules or conditions relating to the incorporation of VSD material through use of one or more libraries. In an embodiment of FIG. 3A, the VSD configuration module 310 has access and use of the design library 350, including design rules and information that may or may not be pertinent to the manner in which VSD material is implemented on the device. The rules and information may include, for example, information for determining the various design parameters 312 from limited user-input. For example, design library 350 may carry information identifying tolerance levels for leakage current and breakdown voltage for different components that may be selected for a particular device. As another example, design library 350 may carry information that identifies spatial constraints, determining how much space may be provided on a device for a particular connection of VSD material deposition. Under one embodiment, some substrates may carry pre-manufactured layers of VSD material having a particular type of configuration. In addition to other kinds of information, the design library 350 may carry information as to the location, type and electrical characteristics of such VSD material.

In addition to the design library 350, the VSD configuration module 310 may have access to the VSD material library 360. The VSD material library 360 may be incorporated or integrated with, for example, the design library 360. The VSD material library 360 may carry data about the pertinent characteristics, including the electrical characteristics, of various types of VSD material. For example, the VSD material library 360 may carry information that references a type of VSD material to a characteristic voltage level, reference measurement of leakage current (or off-state resistance), and required gap distances to that result in a given threshold voltage for switching the material on. The threshold voltage may be used in identifying the level of ESD protection that can be provided by the particular type of VSD material applied across the stated gap distance.

With use of design library 350 or VSD material library 360, the design parameters 312 may be identified from explicit designer input (i.e. explicitly), or inferred or determined programmatically from other input. According to an embodiment, the design parameters 312 may include spatial constraint parameters 322, which includes data that may infer or identify preferred dimensions of interconnectivity or spacing amongst elements. As an addition or alternative, the spatial constraint parameter 322 may expressly define the spacing of VSD material and/or the availability of protective grounding elements and/or other features. As mentioned, the spatial constraint parameters 322 may be based on spatial information that is explicitly provided the designer, or inferred from other information, including the use of the design library 350. For example, the designer may specify a type of circuit board, and the spatial constraint parameters may be identified by cross-referencing the type or circuit board with the design library 350. Thus, for example, a circuit board for a particular kind of application may be associated with a default size range, such as by a value (e.g. "small").

Another one of the design parameters 312 may correspond to tolerance parameters 324. The tolerance parameters 324 may include voltage and/or current values that define, amongst other limits, one or more of the following: (i) operational voltage ranges of some or all of the devices, (ii) breakdown voltages for such devices, and/or (iii) tolerable leakage currents. In one embodiment, the VSD configuration module 310 uses the design library 350 to access information that cross-references specific components that are included on a board or device with their respective tolerance parameters 324. In this way, the tolerance parameters for a device under design or simulation may be determined through input provided by the user, including input corresponding to component selection. The components for use on the device may be also be determined by default or association with other components or input from the user. For example, the designer (or the design library 350) may include information in the form of government regulations or industry standards that require tolerance values that exceed those of the specific devices. Likewise, the designer (or design library 350) may incorporate information relating to factors of safety, or include other conditions from which one or more tolerance levels may be inferred. The tolerance parameters 324 may also be analyzed or subjected to various determinations. For example, tolerances 324 may be regionalized on the substrate device (e.g. voltage tolerance in one region of a substrate may differ from tolerance in another region), or processed to determine lowest or critical values (e.g. the voltage value at which one component will breakdown).

Numerous other design rules or implementation characteristics may be accounted for by the VSD configuration module 310 in its determination of the implementation details for VSD material. For example, design rules, regulations or other factors may set ESD parameters, which may limit the tolerance to voltages that the device as a whole may experience, or alternatively, a specific component or region of the device may experience.

The VSD configuration module 310 uses the various design parameters 312, in connection with VSD material library 360 (and design library 350), to determine implementation details 332 that include one or more of the following: (i) gap value 342, (ii) area determination 344, (iii) shape determination 346, and/or (iv) type determination 348. Other determinations may also be determined, such as volume determination, location determination, or cost range or limits. According to one or more embodiments, each of these determinations may be made based on any one or more of the design parameters 312. For example, the spatial parameter 312 may set constraints on the gap value 342.

However, calculations may be required to ensure the gap value 342 does not result in the threshold voltage level for switching the VSD material on to be too high. The calculation may be determined by identifying the characteristic voltage level of the particular VSD material identified by the type determination 348, and then determining a product value of the characteristic voltage level (per designated length) and the gap value (in terms of the designated length). The determined threshold voltage for the deposit of VSD material (as identified by the type determination 348) across the gap identified by the gap value must also result in a threshold voltage level that is less than the breakdown voltage of components that are to be protected. A factor of safety may also be applied to the breakdown voltage to ensure the threshold voltage level switches on before a damaging event.

Likewise, the type determination 348 may be used to identify leakage or off-state resistance values for a selected VSD material, and the gap value 342 may be used to calculate the leakage current that results from use of the VSD material (leakage current decreases and off-state resistance increases with greater the gap value 342). The resulting leakage current may be compared against tolerable leakage current levels to ensure that the leakage current is less than permitted tolerance levels. In some cases (such as when optimization is performed), some implementation details 332 may dependent on the determination of other implementation details.

The gap value 342 may correspond to a distance of separation provided by VSD material that extends between a conductive element that is to be protected and a protective electrical path. The gap value 342 is illustrated with an embodiment of FIG. 5A. As described below, the gap value 342 sets the triggering threshold voltage level by which a given type of VSD material switches "on". In this respect, the gap value 342 and the VSD type determination 348 may provide the primary implementation determinations 332 for identifying the threshold voltage level (i.e. the "on-voltage" level) of the VSD material when deposited between the two conductors.

The area determination 344 may correspond to a planar measurement of VSD material that provides the gap value 342. While the gap value 342 is the primary factor in determining the overall voltage level for a given type of VSD material, the overall area occupied by the VSD material may increase leakage current and possibly affect the on-voltage level. An embodiment of FIG. 6A and FIG. 6B illustrates how area determination 344 may be implemented, with the general shape of the VSD material forming a concentric circle about the protective conductive path (or the element that is to be protected). As mentioned above, the greater the area for a specific gap value, the more leakage current may be present for a given type of VSD material. And it is possible to achieve significantly different areas without affecting gap value 342. At the same time, however, the larger the value for the area determination 344, the greater the tolerance on the substrate for enabling electrical elements to interconnect the protective electrical path. Thus, one of the considerations in generating area determination 344 is that range of tolerance available to interconnect elements on the substrate (or alternatively to the protective electrical path) when manufacturing is actually performed. This consideration may be quantified by design library 350, input from the user, or assumed from other conditions. Still further, the area determination 344 may be subject to the overall size constraints, as specified by, for example, spatial restraint 312.

The shape designation 346 may specify the default shape from which area determination 344 is provided (e.g. concentric ring), or alternatively act as a modification to the default shape. In one embodiment, for example, the VSD material may be assumed to form a concentric ring or oval about a protective electrical path. The shape designation 346 may modify the default shape with contours so as to reduce the overall area, while maintaining the gap value 342 and the general diameter or size of the conductive element (e.g. grounding via) that is being surrounded. With reduction of area, the shape designation 346 may offer benefits such as decreasing the leakage current from the VSD material deposition. The shape designation 346 may be determined from, for example, use of spatial constraint parameter 322, and possibly motivated by one or more tolerance parameters 324 that indicate lowering of the leakage current is desired or warranted.

The type determination 348 specifies the composition of VSD material that is to be used. Numerous different compositions exist for VSD material, with varying electrical characteristics and mechanical properties. In particular, the characteristic voltage level and the leakage current vary considerably amongst different types of VSD material. The desired electrical characteristics, which may be determined from design parameters 312, may be referenced against the VSD material library 360 to identify one or more types of composition. Other input or considerations, such as desired mechanical properties (e.g. strong adhesion to copper) or cost may also influence the selection.

FIG. 3B illustrates a data structure that may be maintained by the VSD material library 360 (FIG. 3A), under an embodiment of the invention. A table 372 or other data structure may include a plurality of entries 382. Each entry 382 may identify a particular composition of VSD material. Each composition of VSD material may be associated with known (approximated or measured) characteristics, including a characteristic voltage level value 384 and a leakage value 386. Other electrical characteristics may also be maintained. Entries 282 may also include or otherwise be associated with cost values 388. The VSD material library 360 may be accessed by the VSD configuration module 310 in order to identify, for example, the necessary gap values for various types of VSD material that may be under consideration. Based on various criteria, the selection may include use of data from the VSD material library 360.

Figure 4:
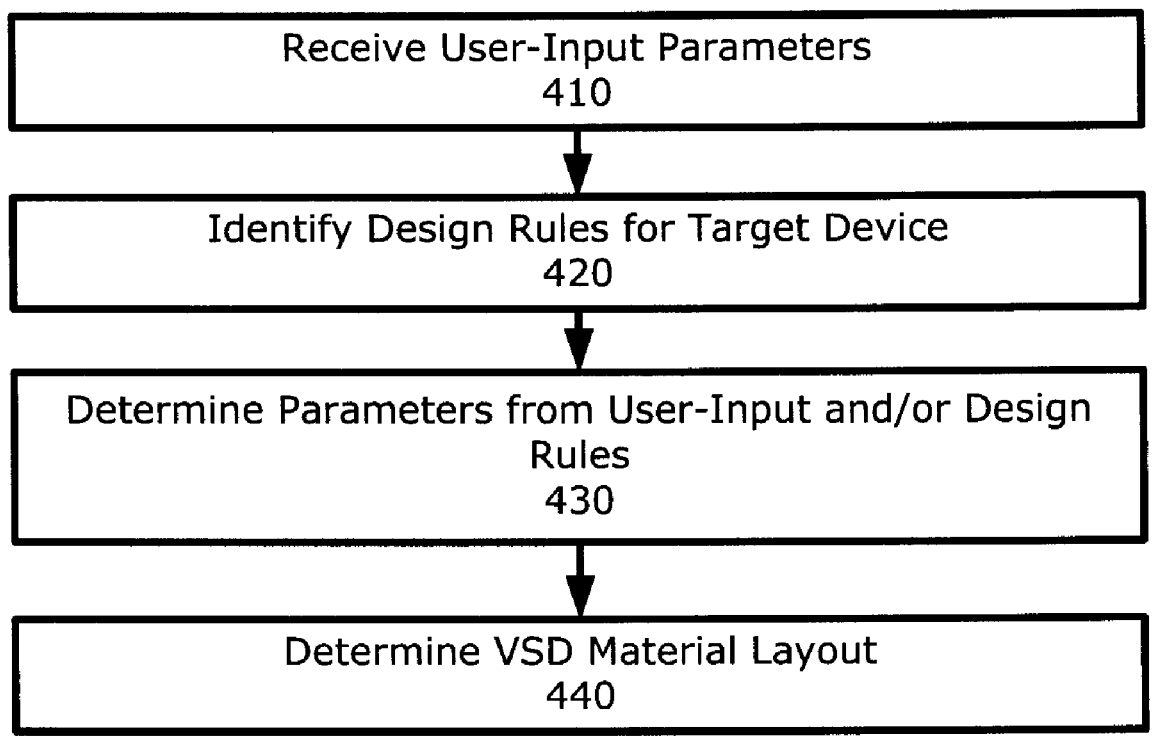
FIG. 4 is a method illustrating how a layout for VSD material implementation may be determined, under an embodiment of the invention.

FIG. 4 is a method illustrating how a layout for VSD material implementation may be determined for a substrate during a design phase, under an embodiment of the invention. A method such as described may be integrated or incorporated with one or more other embodiments. For example, with reference to an embodiment of FIG. 2A, an embodiment such as described in FIG. 4 may be integrated with step(s) 210 and 230 of FIG. 2B, in which substrate design/simulation takes place. Further reference may be made to elements of an embodiment of FIG. 3A, for purpose of illustration.

In a step 410, one or more user-input parameters are received. The user-input parameters may range, depending on implementation detail, from simple to detailed or complex. According to one or more embodiments, the user-input parameters may correspond to one or more of the following: (i) a designer selection to include VSD material protection as an integrated component on the substrate for protection against transient electrical events such as electrostatic discharge, and/or (ii) selection of a specific type of substrate that includes, for example, pre-deposited layer of VSD material. As an alternative or addition, the designer-input may correspond to explicit input in the form of design parameters 312 of an embodiment of FIG. 3A.

Step 420 provides for identification and implementation of design rules for a particular simulation or design. The design rules may be selected by, for example, the particular application, substrate or other parameters. The design rules may specify various conditions and criteria, including protective requirements of individual components or the device as a whole, and/or specification of specific components or types of components that are to be included on the substrate. As an example, the design rules may specify, for a circuit board in a particular application (such as for a wireless device), (i) specific components on the board, (ii) ESD protective requirements for individual components, regions or the entire board; (iii) spatial constraints or parameters on the board, (iv) thickness and other dimensions of the board. In one embodiment, the design library 350 maintains different sets of design rules for various applications that can be designed or simulated by a program implementing a method of FIG. 4.

In step 430, one or more design parameters are programmatically determined, based on the inputs and identifications made in one or both of step 410 or step 420. The determination of such design parameters may result from input from the designer, and other logic in connection with the design library 350 and/or VSD material library 360, to determine anyone or more of the design parameters 312. Thus, for example, the design library 350 may set the requirements for breakdown voltage based on industry or legal standard, as well as on the presence of one or more sensitive components that the designer has selected to use. Likewise, the spatial parameter 322 may be inferred by referencing the type of device that the designer is creating.

In step 440, the implementation details of the VSD material is determined. The implementation details may include any of the implementation details 332 such as described with an embodiment of FIG. 3A, including (i) gap value 342, (ii) area determination 344, (iii) shape determination 346, and/or (iv) type determination 348. In determining the implementation details 332, an embodiment provides for calculating the on-voltage from the product of the gap value 342 and the characteristic voltage of the identified VSD material. Additional or alternative calculations include determining the leakage current for the amount of VSD material that is to be used, as well as the area determination 344 (which may be referenced against the spatial constraint 322). In finalizing the VSD implementation, different types and configurations of VSD material may be processed and analyzed. The selected VSD material may satisfy numerous conditions specified by the design parameters 312 and the design rules. Additionally, the VSD material may be selected based on cost and/or or optimization processes which, for example, seek to prioritize a specific implementation detail 332 (e.g. such as minimizing total area of VSD material).

According to an embodiment, once determinations of implementation details is made, the remainder of the design and/or simulation may be performed with the program incorporating or including anticipated behavior and characteristics of the VSD material (as implemented). Thus, for example, a designer may build a remainder of a circuit board. As an alternative or addition, a simulator may anticipate ESD events and determine the results of such unplanned events on the operation of the device.

VSD Material Implementation at a Protective Path

Figure 5A:
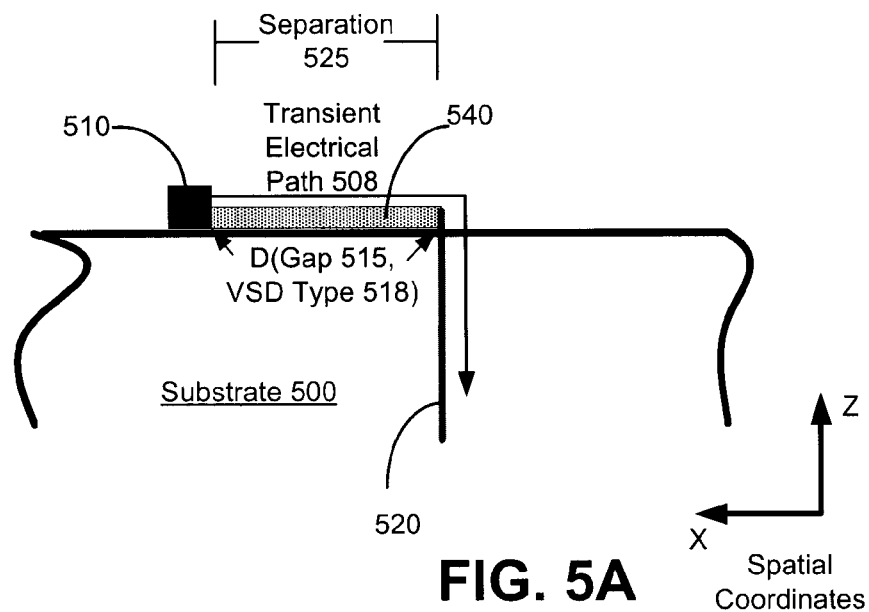
FIG. 5A is an illustrative side-cross sectional view representing a deposit of VSD material at a given point on a substrate 500 during a design or simulation phase, according to an embodiment of the invention.

FIG. 5A is an illustrative side-cross sectional view representing a deposit of VSD material at a given point on a substrate 500 during a design or simulation phase, according to an embodiment of the invention. The gap value 515 may define a separation 525 between a conductive element 510 that is to be protected (from transient electrical event) and a protective electrical path 520. The conductive element 510 may correspond to, for example, a trace or a electrical component. The protective electrical path 520 may be a ground, or a bonding electrical path that serves to remove transient voltages from the operational environment. A deposit of VSD material 540 may span or fill the separation 525. As explained with other embodiments, the VSD material 540 that is used is (which may be identified by the type determination 348) includes the characteristic of being dielectric under normal operating voltages of the substrate. Thus, normal or typical operating voltages of the conductive element 510 should not alter the dielectric characteristic of VSD material 540 deposited in the separation 525. The design may then assume that the conductive element 510 being protected is separated from the protective electrical path 520 under normal operating conditions.

In the presence of a surge or other high voltage, however, the VSD material 540 switches into a conductive state. In the conductive state, the charge from the event is carried to the protective conductive path 520, which may be a ground. In the implementation shown, for example, the protective conductive path 520 is a via extending to an integrated grounding plane positioned within a thickness of the substrate device. As is inherent in the property of VSD material, the transition from dielectric to conductive occurs nearly instantly, so that even in the short time frame of an ESD event, the VSD material 540 becomes conductive before an electrical component connected to the conductive element 510 can be damaged by the ESD event. Thus, the VSD material 540 is able to protect the substrate from the ESD event, by connecting the conductive element 510 to the protective electrical path 520. But this connection only occurs when a transient electrical event of sufficient magnitude occurs. As such, the connection formed across the gap may be termed a transient electrical path 508.

In particular, the transient electrical event must be of a magnitude that exceeds a threshold (or "on") voltage of the VSD material 540. The threshold voltage refers to a minimum voltage that is likely to switch a given deposit of VSD material from dielectric to conductive. If the voltage is on the low-end of the threshold where switch should occur, depending on composition and duration of the event (i.e. power), as well as potentially other factors, the occurrence of the switch may be less than certain. Thus, an embodiment may include a safety factor that places the "on-voltage" of the material well below the breakdown or tolerance voltage of the elements that are being protected.

The determination or estimate of the threshold voltage needed for a given deposit may be determined in part by the characteristic voltage per designated length or amount of the given material. For purpose of the gap value 515, the threshold voltage corresponds to a product of the gap value 515 and a known or estimated characteristic voltage of the VSD material that is being used. In particular, the characteristic voltage may be provided for a given designated length, and the gap value 515 may be defined in terms of the same designated length (e.g. mils). When voltage tolerances are considered or included as one of design parameter 312 (FIG. 3A) for gap value 515, the product of the gap value and characteristic voltage should be less than the voltage tolerance of the design parameter 312 (without consideration of safety factor). A simple equation expressing this relationship is:

$$\text{Gap Value} = (\text{Voltage Tolerance} * \text{Factor Safety})/(\text{Characteristic Voltage}) \quad (1)$$

The Factor of Safety is assumed to be less than 1.0.

The relationship ensures that the transient electrical path 508 is present when electrical events apply potentially damaging voltage levels. This ensures, for example, that the conductive element 510 may be grounded, but only in the presence of an otherwise harmful voltage level.

The various types of VSD material may be distinguished by their compositions, as well as their electrical and/or mechanical properties. As previously noted, the electrical properties include trigger or clamp voltages that make the material conductive. The mechanical properties include the physical nature of the material, which may be based on its composition. One or more embodiments provide for the programmatic determination of the gap value 515 from a selected or preselected type of VSD material 518. For example, under one implementation, the designer may have a preference for a particular type of VSD material because of its material properties (e.g. strength to bond with copper, non-brittleness) or aesthetics. The gap value 515 may be calculated with consideration of the characteristic voltage level of the selected VSD material, and the necessary threshold or "on-voltage" to protect the necessary components or elements of the device.

Under another implementation, a program may be configured to select the least costly VSD material that can provide the desired electrical characteristics. The desired electrical characteristics may be determined by, for example, input from the designer and/or the designer library 350 (FIG. 3A). The desired electrical characteristic may include, for example, the threshold or "on-voltage" that is too define the level of ESD protection, as well as other factors such as leakage current. Spatial constraints may also be considered. For example, the spacing requirements may indicate a relatively crowded environment, so as to give preference or need to VSD material that can provide the desired electrical characteristics in a small gap value. From the desired electrical characteristics, a desired type of VSD material may be selected and identified by the type determination 348 (FIG. 3A). When multiple types of VSD material satisfy the requirements, one or more embodiments provide that other criteria, such as cost, are used to make the selection.

Various other parameters or input may be used to enable the identification of a particular VSD material 518. Each type of VSD material may have a different known or estimated characteristic voltage per designated length. Thus, some types of VSD material may require smaller or larger gap values 515 to provide the desired product or threshold trigger voltage value for an electrical event.

While an embodiment such as described above provides for determination of gap value 515 from the electrical properties of the VSD material 540, other embodiments provide that the gap value 515 is a criteria for the selection of the VSD material. For example, one of the design parameters 312 (FIG. 3A) may provide a designated range for the gap value 515 as a requirement. A program or module configured under an embodiment of the invention may then specify the type 518 of VSD material 540 based in part, on identification of which types of VSD material have the characteristic voltage per linear length to provide the gap value of the desired range. Thus, either of the gap value 515 or type values 518 may be deemed critical, or otherwise prioritized over the other, whether as a global designation or condition on presence of condition or parameters.

Figure 5B:
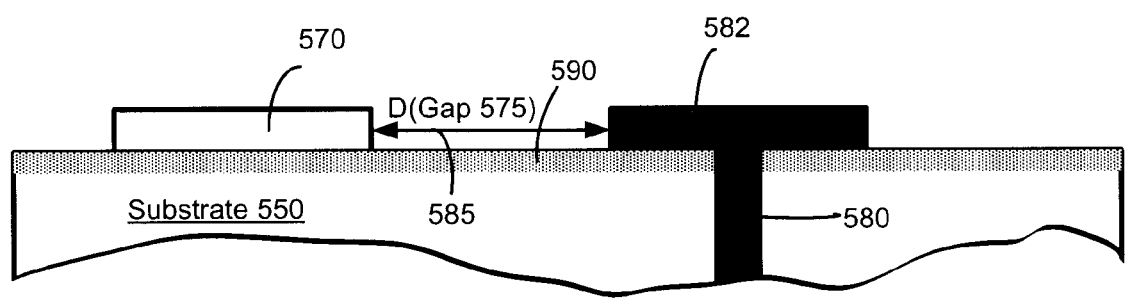
FIG. 5B illustrates a variation in which a protective electrical path includes an antipad, under an embodiment of the invention.

FIG. 5B illustrates a variation in which a protective electrical path includes an antipad, under an embodiment of the invention. According to an embodiment, an antipad 582 may be incorporated on a substrate 500 as part of a protective electrical path. In an embodiment such as shown, the protective electrical path further includes a via 580 that extends inward into the substrate 500. Rather than requiring the VSD material 590 to form a direct connection with the via 580 in order to establish a transient electrical connection, one or more embodiments enable the antipad 582 to form an extended layer or component over the via 580. As the antipad 582 is larger in size than the via 580, the use of the antipad eases the manufacturing tolerance required from the separation that is occupied by the VSD formation 590.

A separation 585 between the conductive element that is to be protected and the antipad 582 may be defined by a gap value 575. The gap value 575 may be determined in a manner such as described with an embodiment of FIG. 5A. As described below, use of antipad 582 may also facilitate shaping the VSD material and/or determining its overall area while maintaining a designated gap value.

FIG. 6A and FIG. 6B are top views of a substrate illustrating the implementation of area considerations for VSD material, according to an embodiment of the invention. In an embodiment, a protective transient path is provided by an antipad 622, which may correspond to a pad or other conductive layer positioned over a via 620 that extends in a Z direction (inward into the paper). The antipad 622 may be rounded or circular in shape in providing a lip or area formation on the via 620. One purpose served by using the antipad 622 is that it increases manufacturing or formation tolerances. In the absence of the antipad 622, precise manufacturing techniques are needed to extend conductive or trace elements to the via 620. Such precision is not always possible or even desirable (such as the case when it is not cost-effective).

As with other embodiments, conductive path 610 that is in need of protection may be separated from the antipad 622 by an area that is defined in part by a gap separation 625. A gap value (such as determined with an embodiment of FIG. 5A) represents the gap separation 625 and may be determined in a manner such as described with other embodiments described herein. In addition to parameters of the gap value 615, another spatial characteristic for the implementation detail is the area occupied by the VSD material. In particular, one or more embodiments determine the total area 615 of VSD material 640 used to separate the antipad 622 from the conductive pad 610. The total area 615 of the VSD material 640 may depend on, for example, the size of the antipad 622, we well as the gap value for separation 625.

In particular, embodiments recognize that size of the antipad 622 may be increased or decreased without affecting the gap value representing the size of the separation 625. FIG. 6B illustrates a variation to an embodiment of FIG. 6A, with the variation being that the dimensions of the formation of VSD material 640 is increased. This increase is illustrated by the height H2 of the VSD material being greater in the formation of FIG. 6B as compared to height H1 of the formation of FIG. 6A. Even with the added dimension, however the gap value representing the separation 625 is unchanged.

Thus, as illustrated by an embodiment of FIG. 6A and FIG. 6B, the area of the VSD material may also be considered as one of the implementation details 332 (see FIG. 3A). In particular, the selection of area (as provided by the area determination 344) has consequences that include (i) potential increase in leakage current, and (ii) lowering of tolerances for aligning and interconnecting elements to the VSD material and/or the antipad 622 (or other element of the protective path). Other considerations may include the cost of additional VSD material, the space occupied by the VSD material, and potential secondary electrical effects such as electric fields.

FIG. 7 illustrates the use of shape as another spatial implementation detail for the integration of VSD material on a substrate or other device during a design or simulation phase, under an embodiment of the invention. On a substrate 700, one or more embodiments provide that a shape designation 735 define a general shape of the VSD material 740, particularly in respect to its concentric separation of the antipad 722 and the conductive element 710. The resulting shape of a VSD formation provided between the conductive element 710 and antipad 722 (or other element of a protective electrical path) may be formed by shaping one or both of the antipad 722 and the VSD material 740.

In one embodiment, a default shape may be assumed to be an annular ring or oval, such as shown and described with an embodiment of FIG. 6A or FIG. 6B. The shape designation 735 parameter may define or specify a shape of a formation, or portion thereof, of VSD material modify the overall shape to alter the size of the area. Among other benefits, an effective area 738 may be maintained at the point of separation 725, which may be specified by the gap value. The effective area 738 corresponds to an area surrounding the antipad 722 that is closest to the conductive element 710 (i.e. where the separation or gap distance is provided). However, the overall area may be reduced, so as to potentially reduce leakage current. Moreover, VSD formation 740 may be shaped to be precise at spot points, rather than at an entire perimeter. As such, shape designation 735 may specify points or regions of contact, where effective area is considered and separation 725 is determined by the gap value. At these specific points or regions, one or more embodiments provide for considerations that include maintaining the overall radius of curvature of the shape of the conductive material 710 to substantially match the perimeter of the VSD material 740.

FIG. 8 illustrates an embodiment in which the implementation details include the determination of some or all of the locations where VSD formations are to provide transient connections to a protective electrical path, under an embodiment of the invention. On a substrate 800, an embodiment provides for programmatic determination of locations 812 ("location determinations 812") where VSD material formations are to be used. In one embodiment, the substrate includes an interior layer of VSD material that spans the entire substrate or at least the portions where electrical elements require protection from ESD. The locations for the VSD formation may be provided by either exposing the underlying VSD material at the select locations, or by extending antipads, vias or other connective elements to the VSD material.

For each locations determination 812, considerations such as described with embodiments of FIG. 5A-FIG. 7 may be determined. For example, the implementation details in the form of gap values may be determined that define the separation of two elements that are to be connected by VSD material under transient conditions. Additionally, the type of VSD material may be determined for the entire substrate, or alternatively different VSD materials may be used at different locations. Area and shape determinations may also be determined on a localized or substrate-wide basis.

Multilayered Devices

Figure 9:
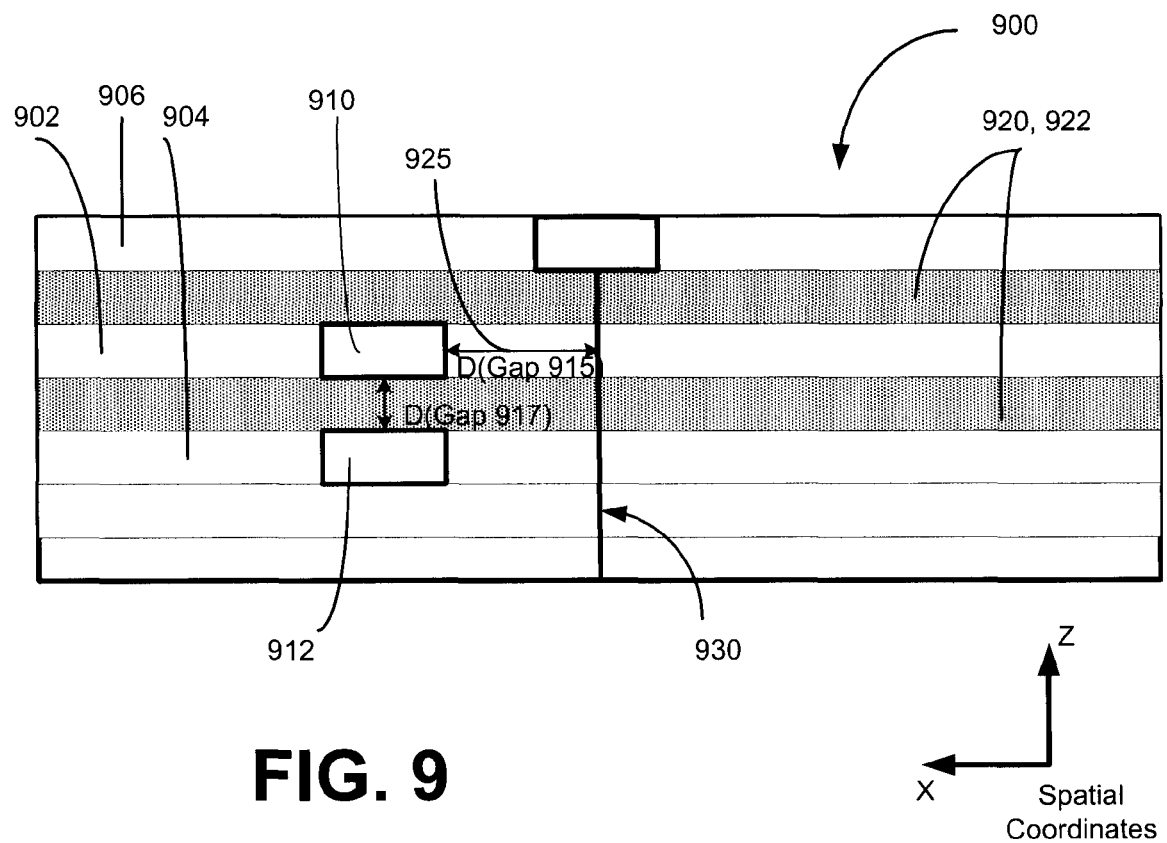
FIG. 9 illustrates the design or simulation for implementing VSD material into a multilayered device, under one or more embodiments of the invention.

FIG. 9 illustrates the design or simulation for implementing VSD material into a multilayered device, under one or more embodiments of the invention. According to an embodiment, a substrate device 900 may include a plurality of layers 902, 904, 906, each of which carry various electrical elements and components. One or more vias may be used to electrically connect layers.

Under embodiments described herein, any of the implementations of VSD material described with embodiments of FIG. 5A thru FIG. 8 may be implemented on individual layers of a multi-layered device. As an addition or alternative, one or more embodiments provide that the device 900 includes multiple layers of VSD material 920, 922. In one implementation, layers of VSD material 920, 922 may separate one or more of the layers on which conductive elements are provided. As described with an embodiment of FIG. 5A, one of the considerations for integrating or incorporating protection with VSD material is the determination of the gap value for individual points in the device that are to be provided with a transient electrical connection to a protective electrical path. On a multilayered device such as described, the gap value may be provided by the shortest distance to the protective electrical path when the transient electrical condition is present.

Individual layers 902, 904, 906 may include elements (in the form of traces or components) that are to be protected by transient electrical condition. A via 930 may intersect the layers and provide a ground or other protective electrical path. According to an embodiment, multiple gap values may be determined to define the separation of different conductive elements and the protective electrical path, under an embodiment such as described. A first gap value 915 may define the separation between a first conductive element 910 (on layer 902) and the via 930. As described with embodiments of FIG. 5A and FIG. 5B, the separation 925 may correspond to a linear dimension of VSD material that separates the first conductive element from the via 930.

A second gap value 917 may define a separation between a second conductive element 912 (on layer 904) and the protective electrical path, which may include the first electrical element 910. The actual measurement of the first and second separations may be different, and reflected by the first gap value 915 and second gap value 917. In an implementation shown by FIG. 9, a first VSD material layer occupies a separation of the second conductive element 912 from a first location of the protective electrical path, corresponding to the via 930. A second VSD material layer occupies a separation of the second conductive element 912 from a second location of the protective electrical path, corresponding to the first electrical element. For the second conductive element, the pertinent formation of VSD material for connecting to the protective electrical path is the one that provides the shortest separation. In the example provided, the second gap value 917 determination may thus be provided for the separation between the first and second conductive elements. The gap values for other transient electrical connections formed with VSD material may be calculated similarly.

Display Backplanes and Devices

Figure 10:
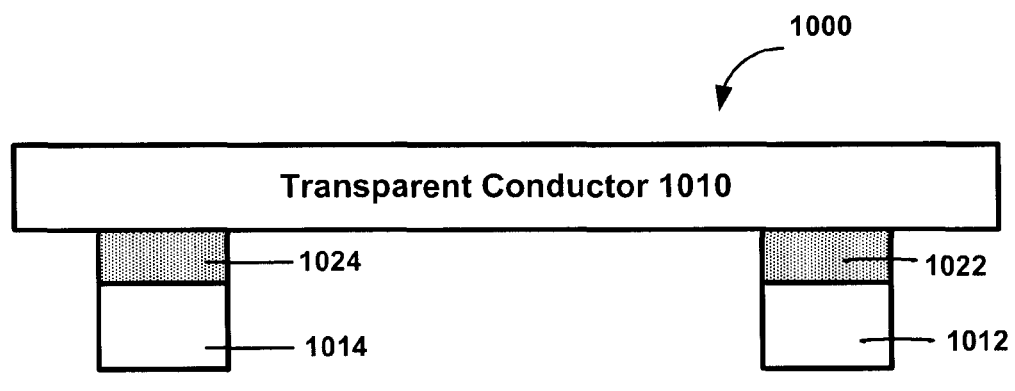
FIG. 10 illustrates a design or a simulation of a backplane of a display device, under an embodiment of the invention.

Embodiments described herein include may be implemented in various applications, such as printed circuit boards. Additionally, as described with an embodiment of FIG. 10, one or more embodiments may be provided on a backplane for a display device 1000. In general, a display device 1000 includes a transparent conductor 1010 that is provided on an exterior of the device. The transparent conductor 1010 may be separated from grounding pads 1012, 1014 (or other points to a protective electrical path) by corresponding VSD material formations 1022, 1024. As explained with other embodiments, the linear dimension of the VSD formations 1022, 1024 may define the threshold or "on-voltage" by which the formations become conductive. When switched into the conductive state, the VSD material formations 1022, 1024 provide grounding to the conductor 1010. In order to prevent obstruction of the transparent conductor 1010, the VSD material formations may be positioned on a perimeter of the device. The linear dimension of the VSD material, as well as other determinations such as type, may be determined in accordance with other embodiments described above.

Optimization

In general, the process of selecting VSD material and designing its integration into a device is a multi-variable consideration in which selection of one desired result may have negative impact to another result. For this reason, an embodiment provides for a prioritization or selection scheme by which a designer may specify one desired characteristic, variable or result over another. More specifically, in the process of determining implementation determinations 332 (See FIG. 3A), one or more embodiments provide that the determinations are made through use of one or more optimization processes. According to an embodiment, the optimization processes may influence which materials are selected, as well as the spatial characteristics of the material selected.

Figure 11:
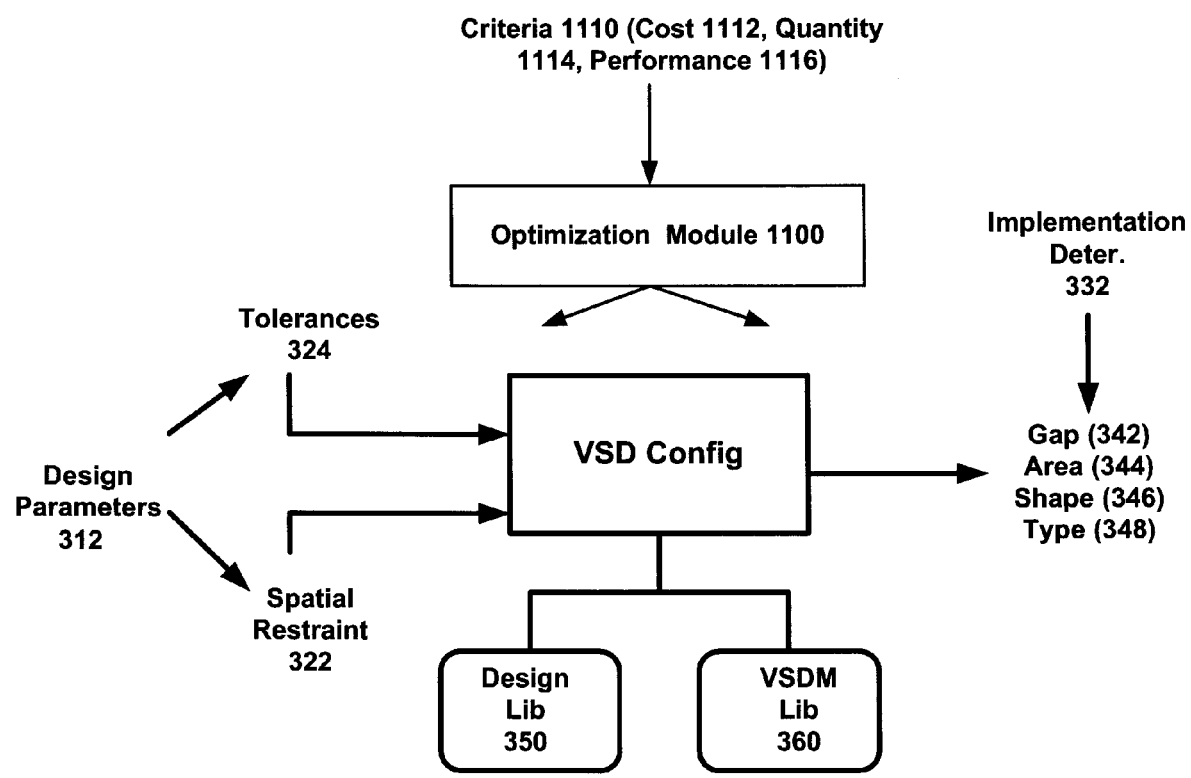
FIG. 11 illustrates use of an optimization module 1100 in connection with a system such as shown and described with an embodiment of FIG. 3A, under an embodiment of the invention.

FIG. 11 illustrates use of an optimization module 1100 in connection with a system such as shown and described with an embodiment of FIG. 3A. The optimization module 1100 may execute one or more processes to select, or influence selection of, one or more of the implementation determinations 332 (see FIG. 3A). In one embodiment, the optimization module 1100 executes a process to select, during a design or simulation mode, a VSD material for use on a substrate. The selection may be made based on one or more optimization criteria. Examples of optimization criteria include (i) a cost parameter 1112, (ii) a quantity parameter 1114, and/or (iii) a performance parameter 1116. The optimization module 1100 may interface or communicate with the VSD configuration module 310 in order to influence selection or use of one of the implementation determinations.

The cost parameter 1112 may reflect the process by which the cost of integrating VSD material into a substrate device is minimized. Factors that may influence the overall cost include the cost of a particular VSD composition, as well as the amount of VSD material from the composition that may be needed. For example, some VSD compositions may require less material, by for example achieving desired performance characteristics using small gap distances and areas. Additionally, some VSD material may be easier to integrate with a device than others. For example, some substrates may include pre-formulated VSD material as a layer within or near a surface of the substrate, so that the addition of another layer after pre-fabrication is more expensive than the use of the pre-formulated VSD material. Thus, more than one factor may influence the cost parameter 1112. The cost parameter 1112 may be provided as either a composite value, or a multi-dimensional parameter having variables that affect the cost of using a particular type of VSD material.

In one embodiment, the cost parameter 1112 may be used to select the VSD material (and thus influence the VSD designation 348). As an alternative or addition, the cost parameter 1112 may influence location determinations 812 (see FIG. 8), the area determination 344, and/or shape designations 346. For example, area and shape designations may be selected to reduce cost, even at the expense of performance. The cost parameter 1112 may consider as a composite value, or combine separate variables that combine to enable determination or estimation of the overall cost of integrating a particular type of VSD material into a particular substrate device.

The quantity parameter 1114 may correspond to a priority to reduce the quantity of VSD material in use on the board. Lesser amounts of VSD material may be desired in the case when, for example, the environment where the VSD material is to be deposited is crowded. In a crowded environment, even small amounts of separation gaps for VSD material may be costly. In order to perform optimization based on the quantity parameter 1114, for example, an embodiment provides that the optimization module 1100 uses the output of the VSD configuration module 310 (FIG. 3A) to determine which VSD material type requires the least area to satisfy the various criteria and design parameters 312. The least area may correspond to, for example, the VSD material with the lowest characteristic voltage, as that material would require the smallest size of gap separation and area.

Figure 13:
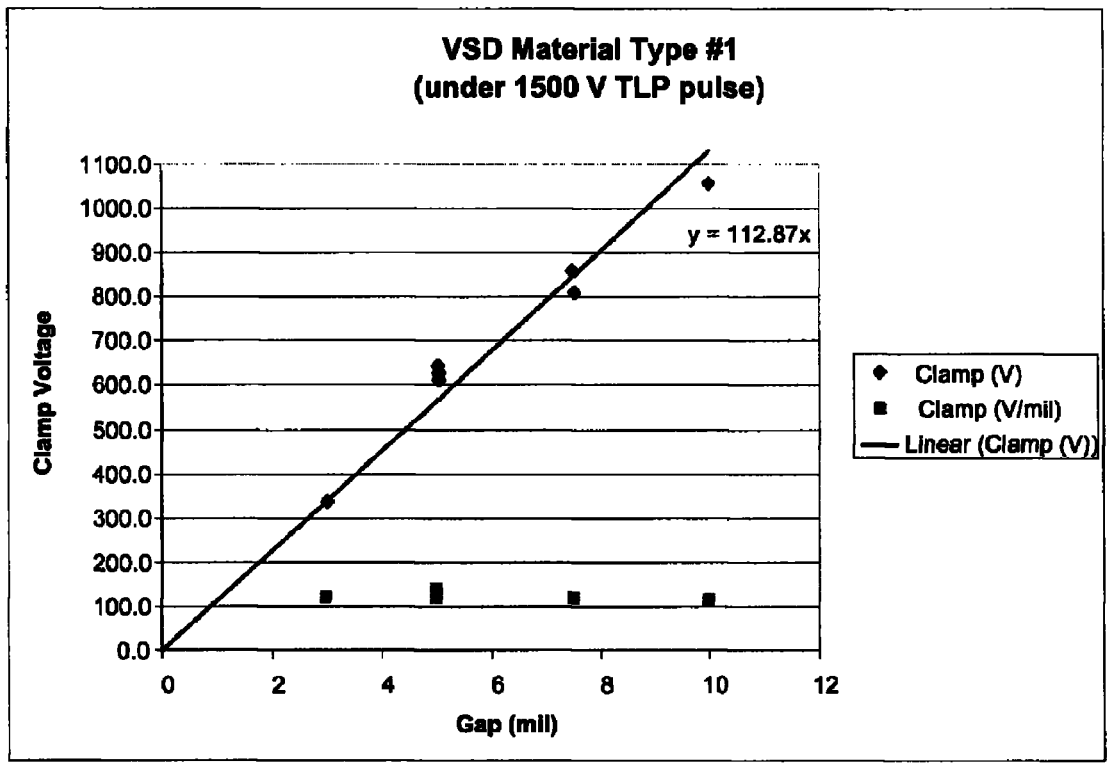
FIG. 13 is a graph representation of a relationship between the threshold voltage level (Y-axis) and the gap value (X-axis), under an embodiment of the invention.
Figure 14:
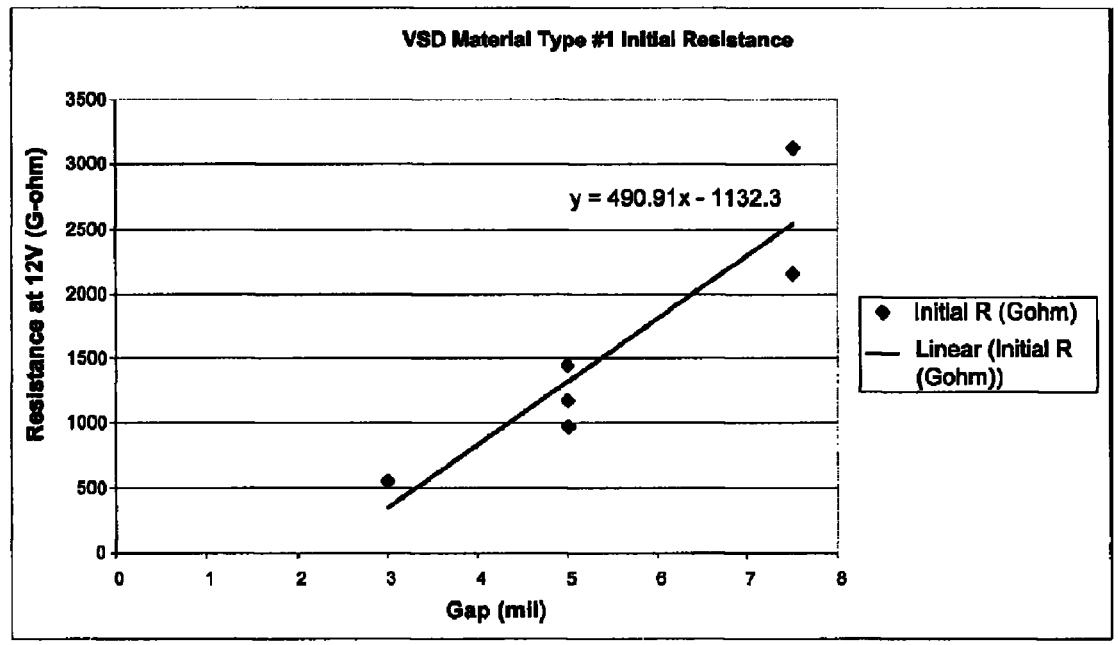
FIG. 14 is a graph illustrating the off-state resistance of VSD material of the first type, as would be determined experimentally across a gap separation of increasing size, under an embodiment of the invention.
Figure 15:
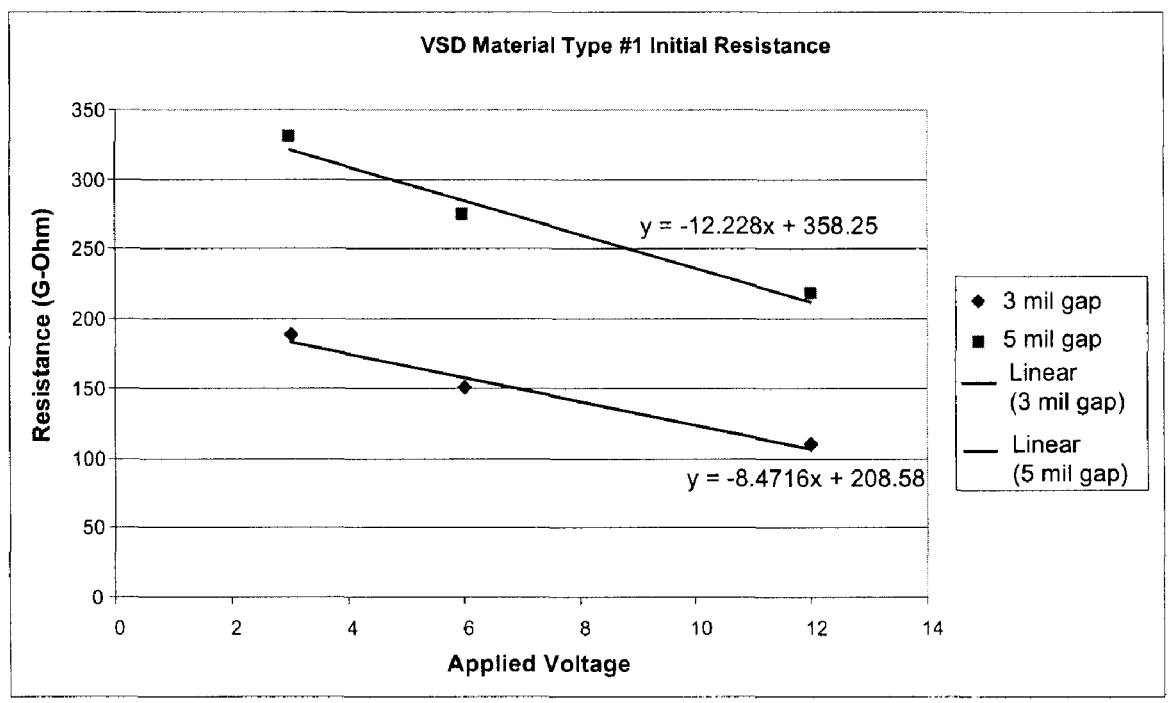
FIG. 15 is a graph of an embodiment illustrating the off-state resistance of VSD material of the first type, for different gap sizes, with effects resulting from operational voltages that range in size.

But as described with examples such as provided with FIG. 13-FIG. 15, other properties of VSD material such as leakage current may play a part in selecting the type of VSD material. In particular, leakage current may, for a given type of VSD material, vary with variations to the size of the gap distance (it is more when the gap size is smaller) and/or the presence and magnitude of the operating voltage of the substrate device. As such, simply identifying the material with the smallest required size of gap separation may not yield optimal or even workable results. Thus, the optimization module 1100 may operate to implement the optimization processes using tolerance levels and necessary gap separation sizes, which may compete with one another. The optimization module 1100 may prioritize one over the other under select conditions. For example, the optimization module 1100 may seek the smallest size of separation distance without causing any of the components to receive leakage current that is greater than a tolerance.

Still further, the optimization module 1100 may optimize to enhance a specific performance characteristic 1116. For example, for sensitive equipment, the VSD material that can be configured to provide the lowest amount of threshold voltage may be selected. This material may, for example, provide the desire characteristic at a low gap separation, while having a leakage current that is within the device's tolerance. Thus, even when performance is considered, the optimization module 1100 may require output of various VSD implementations to select or influence selection of a particular type of VSD material. Examples of performance characteristics include (i) negative presence of capacitance, (ii) impedance, and (iii) heat loss. Any of the optimization processes may optimize for one of these characteristics.

System Description

Figure 12:
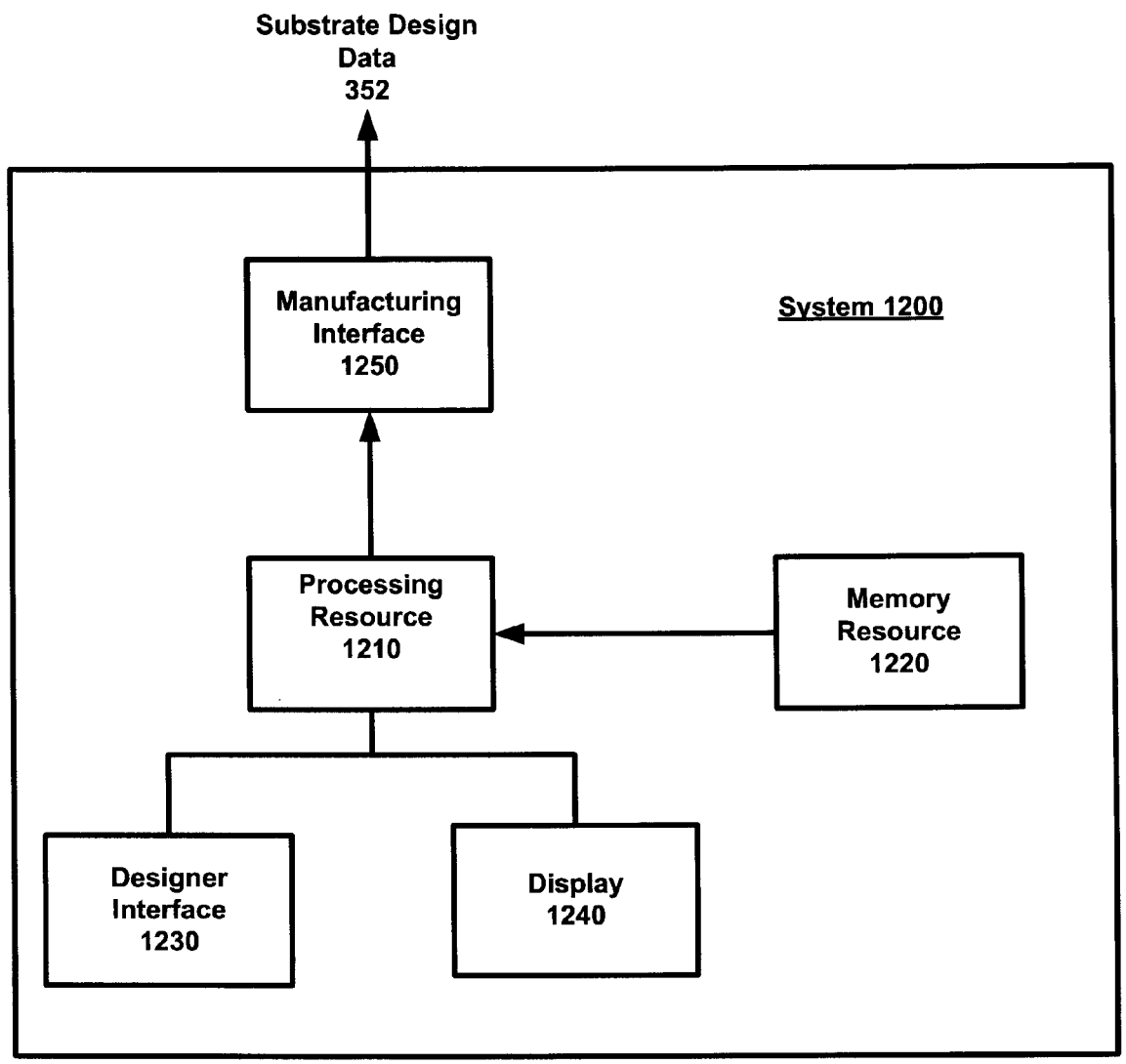
FIG. 12 illustrates a system for use with one or more embodiments.

FIG. 12 illustrates a system for use with one or more embodiments. A system 1200 includes processing resources 1210, memory resources 1220, a designer interface 1230, and a display 1240. The processing resources 1200 may execute modules and functionality such as shown and described with FIG. 1 or FIG. 3A, including, for example, logic 114 (FIG. 1). The memory resources 1220 may store instructions corresponding to the executed modules and functionality, as well as the information and data provided in the design library 350 (FIG. 3A) and VSD material library 360 (FIG. 3A). The design interface may correspond to, for example, a keyboard or mouse or pointer mechanism, although various tools for enabling the user to provide input and receive output are contemplated. The display 1240 may be provided as part of the interface 1230, and may display, for example, the prompts to which the designer responds.

Optionally, the system 1200 may be coupled to a manufacturing interface 1250. The processing resources 1210 may communicate 1210 implementation configurations 332 (FIG. 3A) for a particular design to the manufacturing interface 1250, which may then send instructions to a manufacturing/fabrication site (off-site) or tool (on-site). The manufacturing interface 1250 may generate substrate design data 1252 for the manufacturing site. The manufacturing interface 1250 may be configured to format the substrate design data 1252 and/or communicate the data directly for use with the manufacturing workflow.

IMPLEMENTATION EXAMPLES

The following section provides an implementation example that incorporates one or more embodiments described herein.

Example

A printed circuit board (PCB) may be designed using software (such as an EDA application) configured in accordance with embodiments described herein. The design of the printed circuit board may call for integration of VSD material, for purpose of providing protection against potentially harmful and transient electrical events such as ESD. The PCB design may call for use of three chips, each of which has a different set of tolerances for ESD, leakage current or other electrical properties. Table 1 shows examples of recommended or manufacture-stated tolerances for individual chips. The identified tolerances are for ESD and for off-state resistance. As mentioned elsewhere, the off-state resistance also infers leakage current tolerance. In an embodiment, information provided with Table 1 may be listed in the design library 350 (see FIG. 3). A module for configuring the design of the PCB to include VSD material may access data corresponding to Table 1 as a preliminary step.

TABLE 1

| | Printed Circuit Board ESD | | |
|---|---|---|---|
| Inputs: | on chip ESD protection (V) | min off-state Resistance required (Gohm) | operating voltage |
| Chip 1 | 200 | 100 | 12 |
| Chip 2 | 500 | 500 | 12 |
| Chip 3 | 1000 | 500 | 12 |

An embodiment provides for the programmatic identification of a candidate type of VSD material. As a candidate, the VSD material may not be fully processed to determine whether all of the tolerances and criteria for integrating the VSD material have been satisfied. In analyzing the VSD material as a candidate, electrical properties may be identified in reference to a stated linear dimension, which in the examples provided, is a 1 mil gap. To analyze the voltage level at which the VSD material is turned on, the characteristic voltage level is normalized as the voltage needed to switch the VSD material on when applied across a 1 mil gap. The threshold voltage level (the total voltage needed to switch a quantity of the VSD material on) is then calculated from a product of the characteristic voltage level (per mil) multiplied by the size of the gap (also measured in mils).

FIG. 13 is a graph representation of a relationship between the threshold voltage level (Y-axis) and the gap value (X-axis). For the given type of VSD material, the higher the size of the gap separation, the higher the threshold voltage level. In the example provided, the relationship may be expressed by equation (e.g. linearly), although other curve fitting techniques (e.g. parabolic) may be used to match experimental results. The information and/or data may be maintained in, for example, a data store corresponding to the VSD material library 360 (see FIG. 3). The VSD library 360 may maintain values, or alternatively use a pre-determined equation (e.g. linear relationship) that enables the configuration module 310 to assume values of the threshold voltage level for a given gap separation.

For leakage current/off-state resistance analysis, the following relationships are generally applicable for VSD material: (i) higher gap sizes have greater off-state resistance and less leakage current, and (ii) higher operational voltages have lower off-state resistance and greater leakage current. FIG. 14 is a graph illustrating the off-state resistance of VSD material of the first type, as would be determined experimentally across a gap separation of increasing size. The graph compares the off-state resistance values (Y-axis) to size of the gap separation (X-axis), with the relationship of off-state resistance increasing with higher gap values.

FIG. 15 is a graph illustrating the off-state resistance of VSD material of the first type, for different gap sizes, with effects resulting from operational voltages that range in size, as would be determined experimentally. More specifically, the relationship shows a decrease in off-state resistance (Y-axis) with increase in applied voltage.

Both relationships of FIG. 14 and FIG. 15 may be expressed linearly, using experimental results. Information corresponding to the relationships may be maintained in, for example, a data store corresponding to the VSD library 360 (FIG. 3). The VSD library 360 may maintain values, or alternatively use a pre-determined equation (e.g. linear relationship) that enables the configuration module 310 to assume values of leakage current and off-state resistance, for a given type of VSD material, size of gap separation and/or operating voltage.

With these relationships in mind, an embodiment provides that the VSD material of the first type may be analyzed as a candidate for integration in a substrate device by first determining the size of the gap separation required between each chip and its ground in order to provide the necessary voltage protection against ESD events. The necessary voltage protection requires the threshold voltage level of the VSD material to turn on at a voltage that is below the breakdown voltage, as modified by a safety factor. Under an embodiment, once the size of the gap separation is determined, the size of the gap separation may be used to determine the off-state resistance and/or leakage current.

Following the example provided, the VSD material of Type I may have the characteristic voltage level of 113 volts/mil. The off-state resistance may also be expressed in terms of an equation:

$$(\text{Off-State})\text{Resistance}(\text{Gohm}) = 490.91(\text{gap/mil}) - 1132.3 \quad (2)$$

In the example provided, Equation (2) applies for components that have operating voltages in the range of 12 volts. As shown by FIG. 15, the equation would be different if the operating voltages were different for any particular component.

Table 2 illustrates results of integrating VSD material on the PCB, with its known or assumed electrical characteristics of clamp voltage and its off-state resistance. As mentioned, an embodiment provides for determining the size of the gap separation to satisfy the ESD requirements, and then cross-referencing the size of the gap separation to determine off-state resistance and/or leakage current. Table 2 summarizes the results:

TABLE 2

| | calculated gap (mil) to protect chip | calculated off-state Resistance (G-ohm) at operation voltage | Pass/Fail design parameters |
|---|---|---|---|
| Chip 1 | 1.42 | −437.55 | fail |
| Chip 2 | 3.54 | 604.57 | pass |
| Chip 3 | 7.09 | 2341.43 | pass |

Table 2 shows that in order to achieve the desired ESD protection for Chip 1 on the PCB, the gap separation formed by including the VSD material between (i) Chip 1 and a ground or other protective element would need to be 1.42 mils, (ii) Chip 2 and the ground would be about 3.54 mil, and (iii) Chip 3 would be at 7.09 mil. Under Equation 2, however, the VSD Material Type I fails the off-state requirements of Chip 1.

Under an embodiment, when one component fails, the configuration module 310 (see FIG. 3) or other programmatic component selects another candidate VSD material (or alternatively some other design parameter). The selection of the other candidate VSD material may be for the particular Chip or component, or for the entire substrate device. For example, an embodiment provides that the configuration module 310 seeks to use the same type of VSD material throughout the substrate. The example provided, however, locates VSD Material Type II just for the failed Chip 1. The VSD Material Type II may have a characteristic voltage level of 50 Volts/mil, while for simplicity, the off-state resistance is assumed to be expressed by Equation 2.

Table 3 provides the results for using the VSD Material Type II with to provide a transient connection to ground for Chip.

TABLE 3

| | calculated gap (mil) to protect chip | calculated off-state Resistance (G-ohm) at operation voltage | Pass/Fail design parameters |
|---|---|---|---|
| Chip 1 | 3.20 | 436.02 | pass |
| Chip 2 | 8.00 | 2788.50 | pass |
| Chip 3 | 16.00 | 6709.30 | pass |

ALTERNATIVES

While embodiments described herein provide for determination, in a design or simulation medium, of VSD material or its characteristics for purpose of handling ESD or overvoltage conditions, other embodiments provide that the logic or software makes a determination as to whether VSD material it to be used. For example, the user may specify conditions and parameters that make the use of ESD protection unwanted, in which case logic may make a determination to not include VSD material in the design of the device.

CONCLUSION

Although illustrative embodiments of the invention have been described in detail herein with reference to the accompanying drawings, it is to be understood that the invention is not limited to those precise embodiments. As such, many modifications and variations will be apparent to practitioners skilled in this art. Accordingly, it is intended that the scope of the invention be defined by the following claims and their equivalents. Furthermore, it is contemplated that a particular feature described either individually or as part of an embodiment can be combined with other individually described features, or parts of other embodiments, even if the other features and embodiments make no mentioned of the particular feature. Therefore, the absence of describing combinations should not preclude the inventor from claiming rights to such combinations.

What is claimed is:

1. A system for enabling design or simulation of at least a portion of a substrate device, the system comprising:
a data store that maintains data that references a first entry representing a first type of voltage switchable dielectric (VSD) material with one or more properties of the first VSD material, the one or more properties of the first VSD material including a value representing a characteristic voltage per designated length, the characteristic voltage per designated length corresponding to a known or designated voltage level value that, when applied across a designated length of the first VSD material, causes the first VSD material to switch from a dielectric state into a conductive state;
a configuration module that determines, from one or more interactions with a designer of the system, (i) one or more dimensional parameters that are based on one or more spatial constraints of the portion or of the substrate, and (ii) a voltage level that is tolerable by one or more electrical components that are to be protected in the portion of the substrate device;
wherein the configuration module determines a gap separation that (i) is to be provided by a layer of the first VSD material on at least the portion of the substrate, and (ii) is to separate at least one electrical component from a protective electrical path on the substrate for transient events, wherein the configuration module determines the gap separation based at least in part on determining (i) a threshold voltage level that will likely cause the first VSD material to switch into the conductive state (ii) based on the characteristic voltage per designated length and a size of the gap separation, wherein the threshold voltage level is less than the tolerable voltage level of the one or more electrical components; and
an optimization component that optimizes a configuration, dimension, or type of the first VSD material based on one or more optimization criteria.

2. The system of claim 1, wherein the first programmatic component references multiple entries that each reference a corresponding type of VSD material, the multiple entries including the first entry referencing the first VSD material, and wherein the corresponding VSD material of each of the multiple entries has a different composition.

3. An optimization system for enabling design or simulation of at least a portion of a substrate device, the system comprising:
a data store that maintains information about a plurality of types of voltage switchable dielectric (VSD) materials, the information including a characteristic voltage per designated length for each of one or more types of VSD materials, the characteristic voltage per designated length corresponding to a voltage level applied across a designated length of a particular type of VSD material that is likely to trigger the VSD material of the type to switch from being in a dielectric state to being in a conductive state;
a configuration module that determines, from one or more interactions with a designer of the system, (i) one or more dimensional parameters that are based on spatial constraints of the portion or of the substrate, and (ii) a voltage level that is tolerable by one or more electrical elements that are to be protected in the portion of the substrate device;
wherein the configuration module is configured to determine, for any of the plurality of types of VSD materials, a gap separation that (i) is to be occupied by that type of VSD material on at least the portion of the substrate, and (ii) is to separate at least one electrical element from a protective electrical path for transient events, wherein the configuration module is further configured to determine, for any one of the plurality of types of VSD material, the gap separation needed for using a layer of that VSD material to separate the at least one electrical element from the protective electrical path;
an optimization component that is configured to make a selection of at least one of (i) a selected type of VSD material from the plurality of types of VSD material, or (ii) a size of the gap separation for the selected type of VSD material, wherein the optimization component is configured to make the selection based on one or more optimization criteria.

4. The system of claim 3, wherein the optimization component is configured to make the selection based at least in part on using a determination of the threshold voltage level needed to switch any of the types of VSD material into the conductive state, the threshold voltage level being determined from (i) the characteristic voltage per designated length for that type of VSD material and the (ii) the size of the gap separation; and wherein the optimization component makes the selection so that the threshold voltage level is less than the tolerable voltage level of the one or more components.

5. The system of claim 3, wherein the one or more optimization criteria correspond to at least one of (i) a cost for using each of the types of VSD material, (ii) a performance of each of the types of VSD material, and (iii) a minimization of the size of the gap separation required by use of each type of VSD material.

6. A system for optimizing application of voltage switchable dielectric material on a substrate device, the system comprising:
an interface, the interface being configured to receive one or more criteria from a designer of the substrate device;
a memory resource that stores information about at least one of the substrate or of various types of voltage switchable dielectric (VSD) material;
a processing resource coupled to the interface and to the memory resource, the processing resource being configured to use the input and the information stored in the memory to:
identify one or more criteria for handling of a transient electrical event on the substrate device;
determine, from the one or more criteria, one or more characteristics for integrating VSD material as a layer within or on at least a portion of the substrate device, the layer of VSD material being positioned to protect one or more components of the substrate from the transient electrical event;

identify one or more optimization criteria for integrating the layer of VSD material onto at least the portion of the substrate; and optimize the layer of VSD material based on the one or more optimization criteria.

7. The system of claim 6, wherein the one or more optimization criteria includes one or more of (i) a cost of the layer of VSD material, (ii) one or more dimensions of the layer of VSD material, and (iii) a performance characteristic of the layer of VSD material.

* * * * *